(12) United States Patent
Göbel

(10) Patent No.: US 6,436,836 B2
(45) Date of Patent: Aug. 20, 2002

(54) METHOD OF FABRICATING A DRAM CELL CONFIGURATION

(75) Inventor: Bernd Göbel, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/845,406

(22) Filed: Apr. 30, 2001

Related U.S. Application Data

(63) Continuation of application No. PCT/DE00/02647, filed on Aug. 8, 2000.

(30) Foreign Application Priority Data

Aug. 31, 1999 (DE) .......................... 199 41 401

(51) Int. Cl.⁷ ............................................. H01L 21/311
(52) U.S. Cl. ...................... 438/700; 438/702; 438/703
(58) Field of Search ................................. 438/243, 249, 438/259, 700, 702, 703, 719, 720

(56) References Cited

U.S. PATENT DOCUMENTS

| 5,049,518 A | * | 9/1991 | Fuse ........................... 438/386 |
| 5,442,211 A | * | 8/1995 | Kita ........................... 257/301 |
| 5,519,236 A | * | 5/1996 | Ozaki .......................... 257/302 |
| 5,529,944 A | | 6/1996 | Rajeevakumar ............. 438/242 |
| 5,574,299 A | * | 11/1996 | Kim ............................. 257/296 |
| 5,907,170 A | | 5/1999 | Forbes et al. ................ 257/296 |
| 5,937,296 A | * | 8/1999 | Arnold ......................... 438/243 |
| 6,150,210 A | * | 11/2000 | Arnold ......................... 438/164 |

FOREIGN PATENT DOCUMENTS

| EP | 0 463 389 A1 | 1/1992 |
| EP | 0 852 396 A2 | 7/1998 |
| WO | WO 00/33383 | 6/2000 |

* cited by examiner

Primary Examiner—Benjamin L. Utech
Assistant Examiner—Kin-Chan Chen
(74) Attorney, Agent, or Firm—Laurence A. Greenberg; Werner H. Stemer; Ralph E. Locher

(57) ABSTRACT

A depression is produced in a substrate for a capacitor of a memory cell of the DRAM cell configuration. An insulation and a storage node of the capacitor are produced in the depression. A spacer made of silicon is produced above the storage node. A first part of the spacer is doped by inclined implantation. The spacer is patterned by utilizing the different doping of the first part of the spacer. With the aid of the patterned spacer as a mask, the storage node and the insulation are altered in such a way that the storage node directly adjoins the substrate only in a limited patch of a sidewall of the depression and is otherwise isolated from the substrate by the insulation.

11 Claims, 18 Drawing Sheets

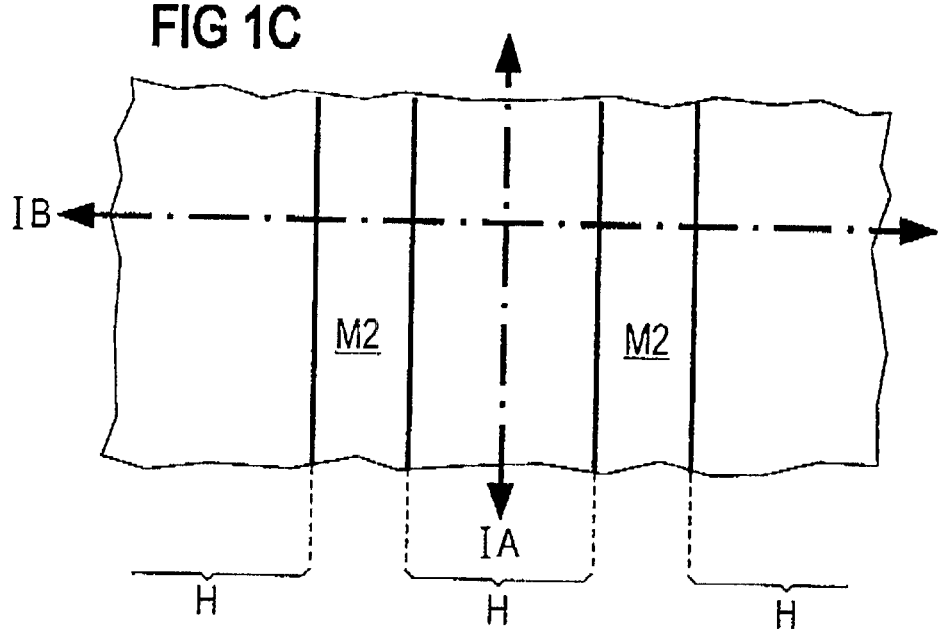
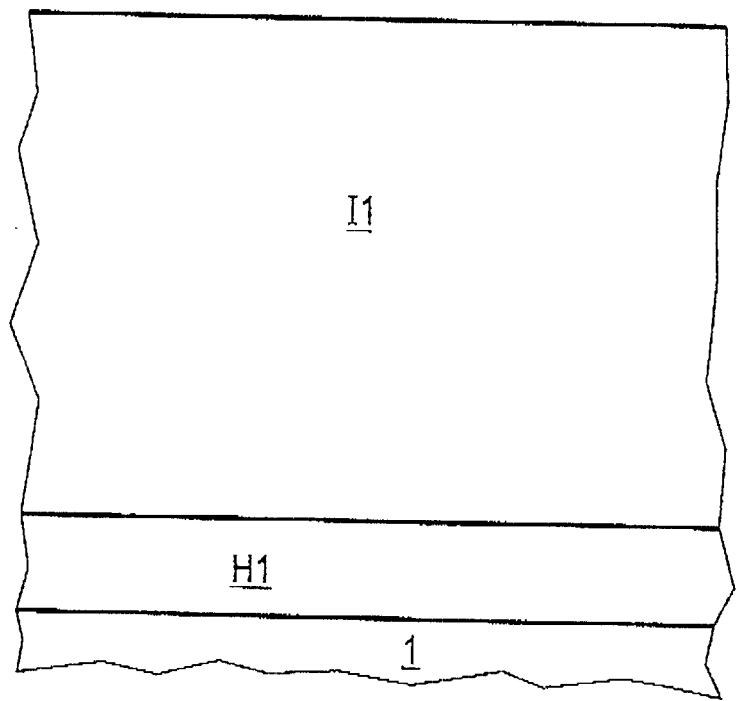

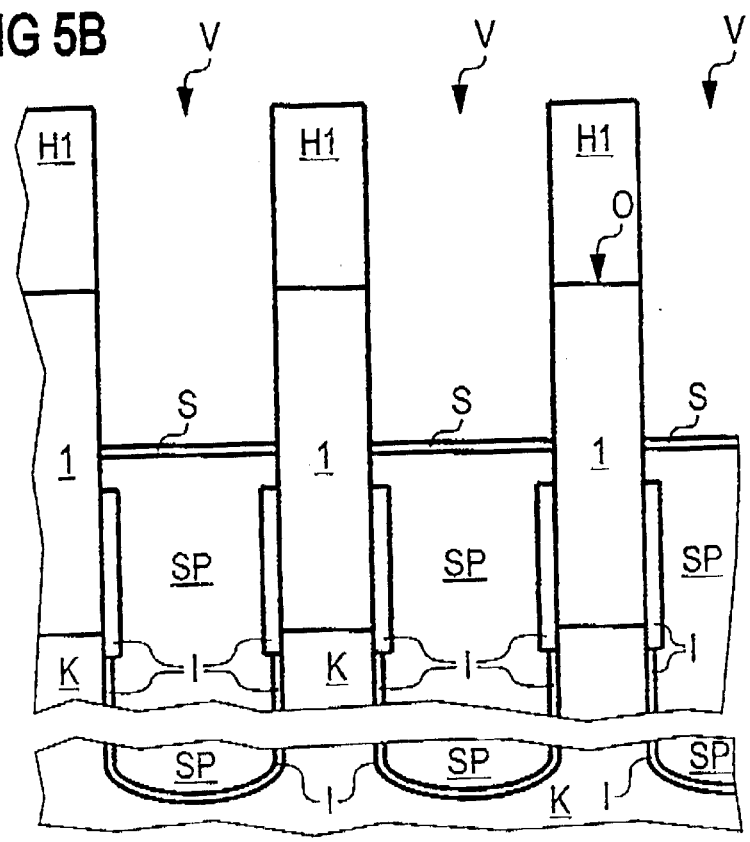
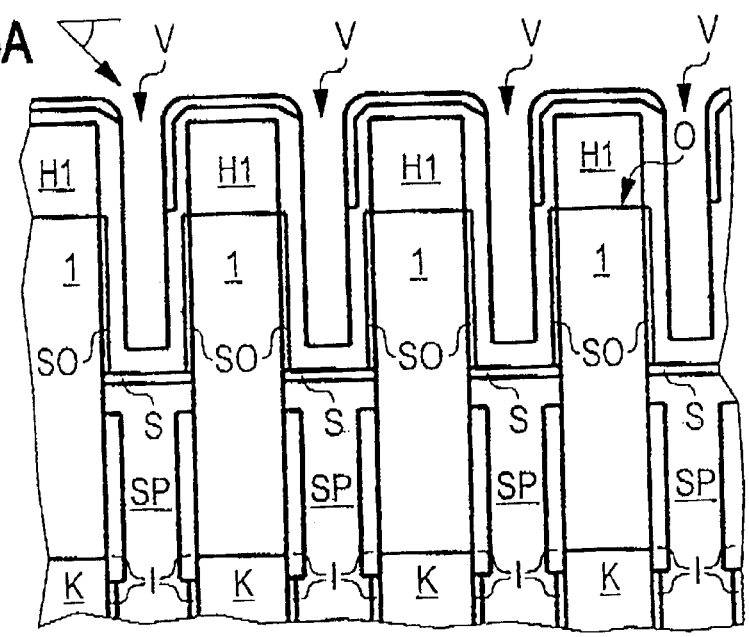

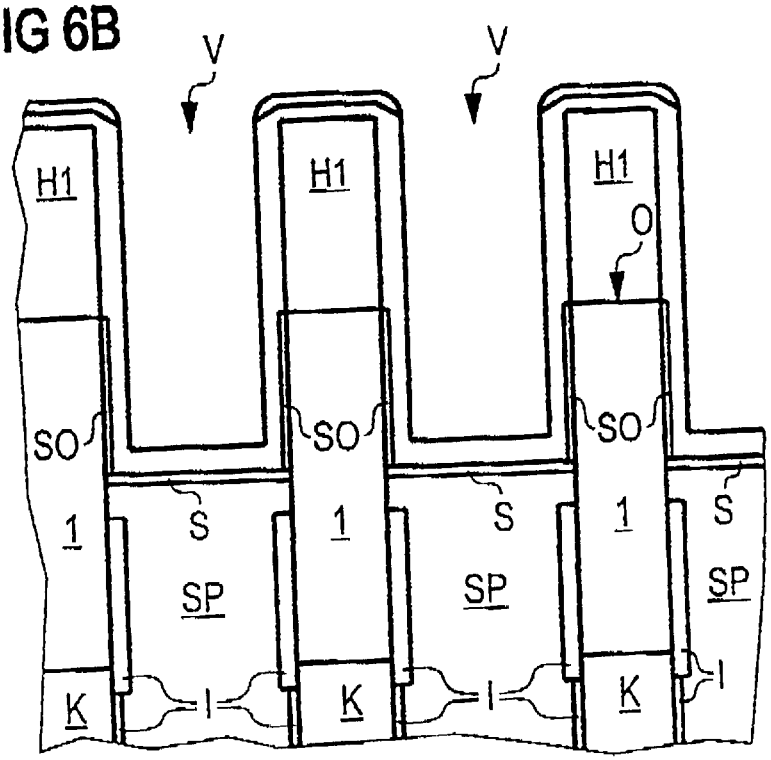
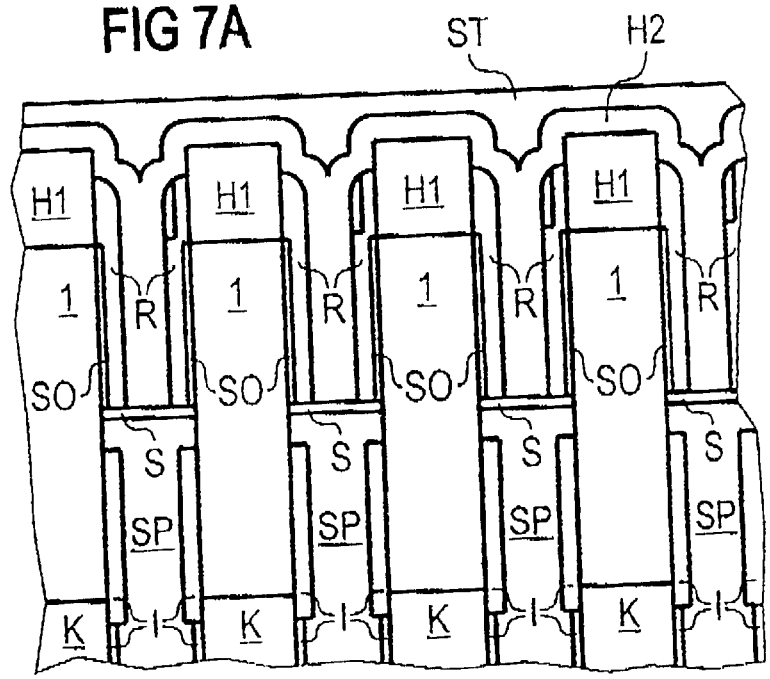

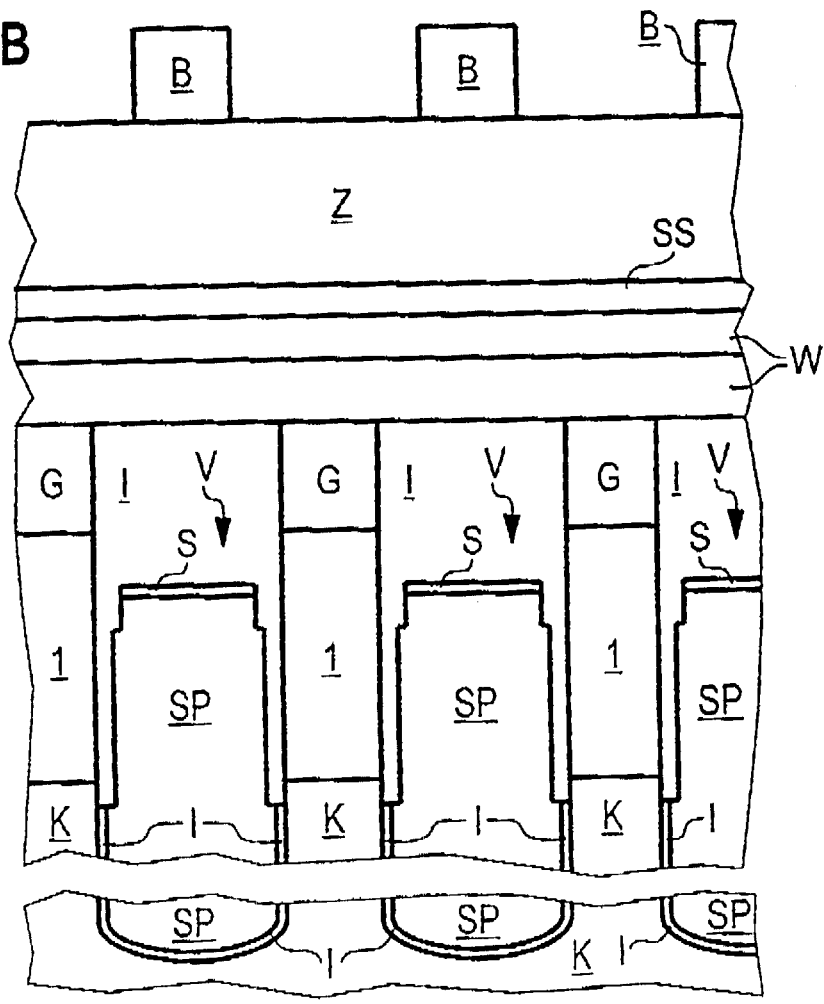
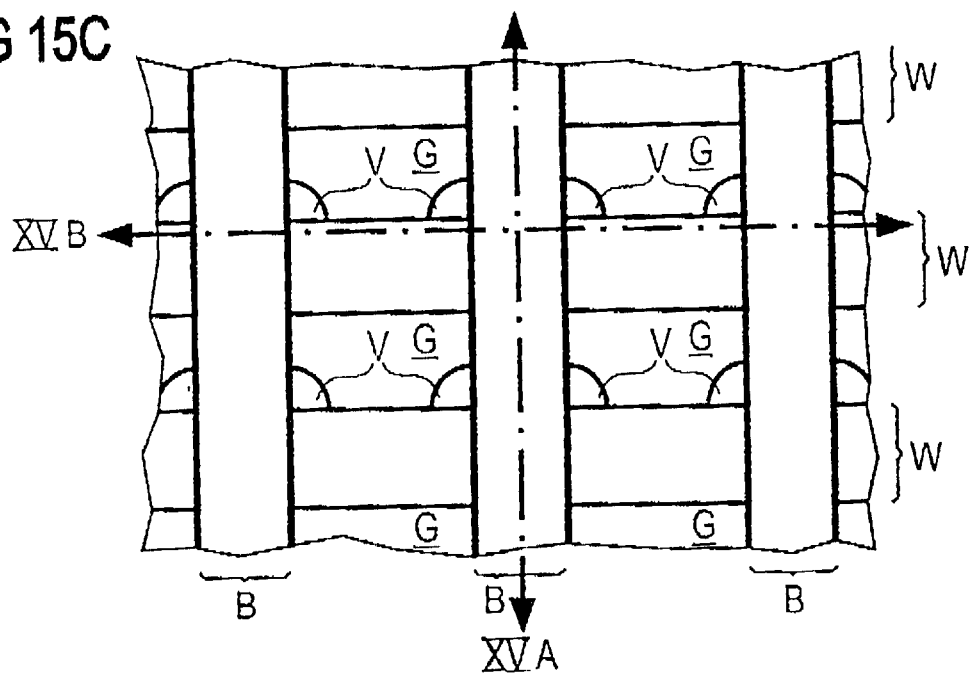

METHOD OF FABRICATING A DRAM CELL CONFIGURATION

CROSS-REFERENCE TO RELATED APPLICATION

This application is a continuation of copending International Application No. PCT/DE00/02647, filed Aug. 8, 2000, which designated the United States.

BACKGROUND OF THE INVENTION

Field of the Invention

The invention pertains to a fabrication method for a DRAM cell configuration, that is to say a dynamic random access memory cell configuration, whose memory cells each comprise a transistor and a capacitor.

In such a DRAM cell configuration, the information of a memory cell is stored in the form of a charge on the capacitor. The transistor and the capacitor of the memory cell are connected to one another in such a way that when the transistor is driven via a word line, the charge of the capacitor can be read out via a bit line.

Endeavors are generally made to produce DRAM cell configurations with a high packing density, that is to say a small space requirement per memory cell.

European published patent specification EP 0 852 396 (see commonly assigned U.S. Pat. Nos. 5,937,296 and 6,150,210) describes a DRAM cell configuration in which, in order to increase the packing density, a transistor of a memory cell is arranged above a storage capacitor of the memory cell. Active regions of the memory cells are in each case surrounded by an insulating structure arranged in a substrate. A depression is produced in the substrate for each memory cell, a storage node of the storage capacitor being arranged in the lower region of the depression and a gate electrode of the transistor being arranged in the upper region of the depression. An upper source/drain region, a channel region and a lower source/drain region of the transistor are arranged one above the other in the substrate. The lower source/drain region is connected to the storage node at a first sidewall of the depression. The insulating structure adjoins a second sidewall—opposite the first sidewall—of the depression, with the result that the storage node does not adjoin the substrate there. A bit line adjoins the upper source/drain region and runs above the substrate. In order to fabricate the DRAM cell configuration, firstly the insulating structure is produced. The bit line is produced on a surface of the substrate. The upper source/drain region is produced by the diffusion of dopant from the bit line into the substrate. The depression is produced in a manner adjoining the insulating structure. Sidewalls of the depression are provided with a capacitor dielectric. The depression is filled with doped polysilicon up to a first height, which lies in the region of the insulating structure. Uncovered parts of the capacitor dielectric are removed. Afterward, the depression is filled with doped polysilicon up to a second height, which is higher than the first height and lies in the region of the insulating structure, with the result that the polysilicon forms a storage node which adjoins the substrate at the first sidewall of the depression between the first height and the second height. The lower source/drain region is formed by the diffusion of dopant from the storage node into the substrate.

SUMMARY OF THE INVENTION

The object of the present invention is to provide a method of producing a DRAM cell configuration which overcomes the above-noted deficiencies and disadvantages of the prior art devices and methods of this general kind, and which process leads to a DRAM cell having a higher packing density in comparison with the prior art.

With the above and other objects in view there is provided, in accordance with the invention, a method of fabricating a DRAM cell configuration, which comprises the following steps: producing a depression for a capacitor of a memory cell of the DRAM in a substrate;

producing in the depression an insulation and a storage node of the capacitor, wherein the capacitor is at least partly isolated from the substrate by the insulation;

producing a spacer of silicon above the storage node in the depression along sidewalls of the depression, by deposition, etching back, and inclined implantation of silicon, wherein a first part of the spacer and a second part, opposite the first part, of the spacer are doped differently;

patterning the spacer by removing one of the first part of the spacer and the second part of the spacer utilizing the different doping thereof;

altering the insulation and a first part of the storage node disposed under the removed part of the spacer, such that either the first part of the storage node or a second part of the storage node disposed under the remaining part of the spacer, adjoins the substrate, and thereby utilizing the patterned spacer as a mask;

producing a transistor of the memory cell such that a first source/drain region is formed in the substrate adjoining the storage node;

producing and connecting a word line to a gate electrode of the transistor; and producing a bit line running transversely with respect to the word line and connecting the bit line to the memory cell.

In other words, the above objects are satisfied with the method of fabricating a DRAM cell configuration, in which a depression is produced in a substrate for a capacitor of a memory cell of the DRAM cell configuration. An insulation and a storage node of the capacitor, which is at least partly isolated from the substrate by the insulation, are produced in the depression. By deposition, etching back and inclined implantation of silicon, a spacer made of silicon is produced above the storage node in the depression along sidewalls of the depression, in which a first part of the spacer and a second part—opposite to the first part—of the spacer are doped differently. The spacer is patterned by either the first part of the spacer or the second part of the spacer being removed by utilizing their different doping. A first part of the storage node, said first part being arranged under the removed part of the spacer, and the insulation are altered in such a way that either the first part of the storage node or a second part of the storage node, said second part being arranged under the remaining part of the spacer, adjoins the substrate, the patterned spacer serving as a mask. A transistor of the memory cell is produced in such a way that a first source/drain region is formed in the substrate in a manner adjoining the storage node. A word line is produced and connected to a gate electrode of the transistor. A bit line running transversely with respect to the word line is produced and connected to the memory cell.

The spacer is composed, for example, of polysilicon or amorphous silicon.

The patterned spacer acts as a mask in that the remaining part of the spacer protects the second part of the storage node from process steps.

Since the storage node does not adjoin the substrate both with its first part and with its second part, an adjacent memory cell can be arranged in direct proximity to the depression, without leakage currents occurring between the storage node and the adjacent memory cell. The storage node is isolated from the adjacent memory cell by the insulation in the depression. An insulation structure outside the depression which isolates the storage node from the adjacent memory cell is not necessary, with the result that the DRAM cell configuration can have a particularly high packing density. The single-sided alteration of the storage node and of the insulation is effected in a self-aligned manner, that is to say without the use of a mask to be aligned. This is a major advantage with regard to a high packing density since there is no need to take account of a space requirement for alignment tolerances.

Since insulation structures which are arranged outside the depression and reach down into regions of the first source/drain regions of the transistors of the memory cells are not required, the invention makes it possible to fabricate a DRAM cell configuration in which channel regions of the transistors are electrically connected to one another or to the substrate. In this case, charge carriers generated in the channel region can flow away, thereby avoiding what are referred to as floating body effects, such as, for example, an alteration of the threshold voltage of the transistor.

To that end, it is advantageous if, after the completion of the storage node, dopant diffuses, during a heat-treatment step, from the storage node into the substrate and forms the first source/drain region there. In this case, in particular, the storage node is at least partly composed of doped polysilicon, for example.

As an alternative, the first source/drain region is produced by patterning a doped layer buried in the substrate. The doped layer is patterned through the depressions and through isolation trenches which cut through the doped layer. In this case, the channel regions of the transistors are electrically isolated from one another and from the substrate.

It lies within the scope of the invention for the storage node and the insulation firstly to be produced in such a way that both the first part of the storage node and the second part of the storage node adjoin the substrate. The first part of the storage node is subsequently removed using the patterned spacer as a mask. The insulation is enlarged in such a way that it replaces the first part of the storage node. Consequently, only the second part of the storage node adjoins the substrate.

A method is described below by means of which the storage node and the insulation are initially produced in such a way that both the first part of the storage node and the second part of the storage node adjoin the substrate:

After depression has been produced, the insulation is produced in such a way that it covers sidewalls and a bottom of the depression. Conductive material is deposited and etched back down to a first height. Uncovered parts of the insulation are subsequently removed, with the result that the insulation likewise reaches only as far as the first height. By depositing further conductive material and etching it back as far as a second height, which lies above the first height, the storage node is produced, which adjoins the substrate between the first height and the second height, while it is isolated from the substrate by the insulation below the first height.

After the removal of the first part of the storage node, the insulation can be enlarged by depositing insulating material and etching it back.

It lies within the scope of the invention for the storage node and the insulation firstly to be produced in such a way that neither the first part nor the second part of the storage node adjoin the substrate. Using the patterned spacer as a mask, the insulation is removed in the region of the first part of the storage node. By depositing conductive material and etching it back, the first part of the storage node is subsequently enlarged, with the result that it adjoins the substrate. In this case, only the first part of the storage node adjoins the substrate.

To that end, after the production of the depression, the insulation can firstly be produced in such a way that it covers the sidewalls and the bottom of the depression. Conductive material is subsequently deposited and etched back. The storage node thereby produced initially adjoins the substrate neither with its first part nor with its second part.

Only a few possibilities will be described with regard to how the spacer can be patterned by utilizing the different doping of the first part and of the second part:

If the first part of the spacer is doped with n-doping ions, then the first part of the spacer can be etched away selectively with respect to the second part of the spacer. A suitable etchant is $HNO_3$+COOH+HF, for example. Consequently, the removed part of the spacer is the first part of the spacer. The remaining part of the spacer is the second part of the spacer. In this case, the second part of the spacer is preferably essentially undoped.

If the first part of the spacer is doped with p-doping ions, then the second part of the spacer can be etched away selectively with respect to the first part of the spacer. A suitable etchant is choline or KOH, for example. Consequently, the removed part of the spacer is the second part of the spacer, while the remaining part of the spacer is the first part of the spacer. In this case, the second part of the spacer is preferably essentially undoped.

If, during the implantation, the spacer is not implanted throughout its vertical extent, then a further part of the spacer is arranged under the first part of the spacer. After the removal of the first part of the spacer, this further part of the spacer continues to be arranged above the first part of the storage node. In order to uncover the first part of the storage node in order that it can be altered, the further part of the spacer is removed. This can be done by anisotropic etching, the remaining part of the spacer being attacked at the same time. However, since the remaining part of the spacer has a larger vertical extent than the further part of the spacer, even after the removal of the further part of the spacer the patterned spacer covers the second part of the storage node and consequently protects it.

A further possibility for patterning the spacer consists, in the case of an n-doped first part of the spacer, in firstly carrying out a thermal oxidation. Since the first part of the spacer has a higher concentration of n-doping ions than the second part of the spacer, the oxide grows more thickly on the first part of the spacer than on the second part of the spacer. The oxide is subsequently etched until the second part of the spacer is uncovered. Since the oxide on the first part of the spacer is particularly thick, a part of the oxide remains on the first part of the spacer and protects it. During the patterning of the spacer, silicon is etched selectively with respect to the oxide, with the result that the second part of the spacer is removed.

The same principle can be employed if the first part of the spacer is implanted with nitrogen or with oxygen. In the case of implantation with nitrogen, the oxide grows more slowly on the first part than on the second part. In the case of implantation with oxygen, the oxide grows more slowly on the second part than on the first part.

In order to ensure that, during the implantation of the first part of the spacer, the dopant reaches that edge of the spacer which faces the sidewall, it is advantageous to carry out a heat-treatment step during which the dopant can diffuse.

In order to simplify the process and in order to increase the process reliability, it is advantageous to use the remaining part of the spacer as a spacer for the gate electrode. In this case, after the completion of the storage node, the remaining part of the spacer is removed and at least partly replaced by the gate electrode. The fabrication process is particularly simple since the gate electrode is produced in a self-aligned manner, that is to say without the use of a mask to be aligned. To ensure that the gate electrode is electrically insulated from the storage node, an insulating layer is produced on the storage node before the spacer is produced. The spacer is produced on the insulating layer. Consequently, this insulating layer also isolates the gate electrode from the storage node. In order to uncover the first part of the storage node so that it can be altered, an uncovered part of the insulation layer is removed after the patterning of the spacer.

A second source/drain region of the transistor is produced above the first source/drain region of the transistor, with the result that the transistor is formed as a vertical transistor. Such a DRAM cell configuration can have a particularly high packing density on account of the vertical formation of the transistor. Since the gate electrode is formed above the second part of the storage node, in this case the first source/drain region should adjoin the second part of the storage node. Thus, the second part of the storage node adjoins the substrate, while the first part of the storage node does not adjoin the substrate. Since the gate electrode is spaced apart from parts of the substrate which are arranged in the region of the first part of the storage node, the formation of a capacitance between the gate electrode and the substrate is prevented.

By way of example, the word line can be produced above the substrate and adjoin an upper part of the gate electrode. The insulation is enlarged, for example, by depositing insulating material and etching it back until the remaining part of the spacer is uncovered.

In the case where the remaining part of the spacer serves as a spacer for the gate electrode, it is advantageous if the remaining part of the spacer is not attacked during the patterning of the spacer. In particular when the first part of the spacer is removed selectively with respect to the second part of the spacer, it is advantageous if no further part of the spacer is arranged under the first part of the spacer. In other words, the first part of the spacer encompasses the entire vertical extent of the spacer. In this case, the inclined implantation is effected at an angle at which the spacer is implanted throughout its vertical extent.

In the case where such inclined implantation is not carried out, in other words lower regions of the spacer are not implanted, it is advantageous to carry out a heat-treatment step, during which dopant diffuses from the first part of the spacer into the underlying further part of the spacer. As a result, the further part of the spacer can likewise be etched away selectively with respect to the second part of the spacer, with the result that the second part of the spacer is not attacked.

In order to prevent, in the process, dopant from diffusing from the first part of the spacer into the second part of the spacer, it is advantageous to separate the spacer before the heat-treatment step, with the result that the first part of the spacer is electrically isolated from the second part of the spacer.

Such separation can be effected for example by masked etching of the spacer.

In order to increase the process reliability, it is advantageous, however, if the separation is effected in a self-aligned manner, that is to say without the use of a mask to be aligned. To that end, a first auxiliary layer can be produced on the substrate, auxiliary trenches which essentially run parallel to one another and are arranged next to one another being produced in said auxiliary layer, which auxiliary trenches do not cut through the first auxiliary layer. The depressions of the memory cells are produced in the auxiliary trenches. After the production of the spacer, a second auxiliary layer made of a first material, which can be etched selectively with respect to silicon, is deposited essentially conformally, the second auxiliary layer being so thin that the auxiliary trenches are not filled. A second material, which can be etched selectively with respect to the first material, is deposited and etched back until the second material is present as a strip-type structure only within the auxiliary trenches. Uncovered parts of the second auxiliary layer are removed selectively with respect to the second material, with the result that the spacer is partly uncovered. Silicon is subsequently etched until the spacer is separated. The separated spacer is subsequently patterned.

It is advantageous for the first auxiliary layer and the second auxiliary layer, which act as a mask during the separation of the spacer, to be used in order to alter the storage node in such a way that, before the alteration of its first part, it adjoins the substrate only with its first part and with its second part. To that end, using the first auxiliary layer and the second auxiliary layer as a mask, parts of the storage node are removed and replaced by insulating material. As an alternative, it is possible to produce isolation trenches which reach down into the region of the storage node, where they isolate the storage node from the substrate.

If the remaining part of the spacer serves as a spacer for the gate electrode, then the separation of the spacer brings about a restriction of the channel width of the transistor. This is advantageous in particular when the depression has curved sidewalls. As is known, the quality of a gate dielectric grown by thermal oxidation is poorer on curved areas than on planar areas. Consequently, it is advantageous to limit the channel to planar sections of the sidewalls of the depression.

A method is described below with regard to how the second source/drain region can be produced:

After the alteration of the insulation and of the storage node, insulating material is deposited and etched back until the remaining part of the spacer is uncovered. The remaining part of the spacer is removed. A third auxiliary layer is deposited to a thickness such that the auxiliary trenches are not filled. A third material is deposited and etched back until the third material is present only within the auxiliary trenches and forms a respective strip-type mask in the auxiliary trenches. Uncovered parts of the third auxiliary layer are removed selectively with respect to the mask. Parts of the first auxiliary layer which are arranged outside the mask are removed and parts of the substrate which are arranged underneath are uncovered. The substrate is then etched selectively with respect to the mask, with the result that isolation trenches are produced. The mask and first auxiliary layer are then removed. The second source/drain regions are produced in parts of the substrate which are arranged under the mask. The isolation trenches are produced in such a way that they are deeper than the second source/drain regions. The second source/drain regions are arranged in the region of the auxiliary trenches and in each case between two of the depressions. The second source/drain regions are isolated from one another by the depressions and by the isolation trenches.

The second source/drain regions can be produced by implantation after the removal of the mask and of the first auxiliary layer. As an alternative, the second source/drain regions are produced by patterning a doped layer produced in the region of the surface of the substrate, by this doped layer being patterned through the depressions and through the isolation trenches.

In order that a dimension of the second source/drain regions corresponds to the channel width, it is advantageous if a thickness of the third auxiliary layer corresponds to the sum of the thickness of the spacer and of the second auxiliary layer.

In order to simplify the process and in order to increase the process accuracy, it is advantageous if the depressions are produced in a self-aligned manner in the auxiliary trenches in such a way that their horizontal cross section in each case reaches from one sidewall to the other sidewall of the corresponding auxiliary trench.

To that end, by way of example, a first mask layer is deposited over the first auxiliary layer before the latter is patterned, and a second mask layer is deposited over said first mask layer. The auxiliary trenches are subsequently produced, the first mask layer and the second mask layer also being cut through. The first insulating structures are subsequently produced by material being deposited and etched back until the second mask layer is uncovered. With the aid of a strip-type photoresist mask whose strips run transversely with respect to the auxiliary trenches, the first insulating structures are etched selectively with respect to the photoresist mask and with respect to the second mask layer until the auxiliary trenches are partly uncovered. The uncovered parts of the first auxiliary layer at the bottoms of the auxiliary trenches are removed until the substrate is partly uncovered. The uncovered parts of the substrate are subsequently etched, thereby producing the depressions. The first mask layer and the first insulating structures serve as a mask in this case.

In order to avoid leakage currents on account of the formation of local field spikes at edges of the depressions, it is advantageous to produce rounding elements which likewise serve as a mask during the production of the depressions. To that end, material of the first mask layer is deposited, etched back and subsequently etched isotropically, with the result that the first material rounds off edges which are formed within the first auxiliary layer. The depressions that are subsequently produced have no edges.

The insulation in the depressions serves at least partly as a capacitor dielectric of the capacitors. Capacitor electrodes of the capacitors are formed as doped regions in the substrate in a manner adjoining the capacitor dielectric. The capacitor electrodes may be contiguous and form a common capacitor electrode for all the capacitors. The capacitor electrodes may be produced for example by the outdiffusion of dopant from a dopant source introduced into the depressions. As an alternative, the capacitor electrodes are produced from a doped layer buried in the substrate.

It lies within the scope of the invention for the insulation to be made particularly thick above the capacitor electrode.

The spacer is produced by depositing silicon and etching it back. The inclined implantation can be carried out before or after the etchback.

Other features which are considered as characteristic for the invention are set forth in the appended claims.

Although the invention is illustrated and described herein as embodied in a method of fabricating a DRAM cell configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1C shows a plan view of the substrate after the process steps from FIG. 1A, illustrating the auxiliary trenches and the second mask layer;

FIG. 2A shows the cross section from FIG. 1A after first insulating structures have been produced;

FIG. 5B shows the cross section from FIG. 3B after the process steps from FIG. 5A;

FIG. 6A shows the cross section from FIG. 5A after a protective oxide has been produced and amorphous silicon has been deposited and subjected to inclined implantation;

FIG. 6B shows the cross section from FIG. 6B after the process steps from FIG. 6A;

FIG. 7A shows the cross section from FIG. 6A after spacers, a second auxiliary layer and strip-type structures have been produced;

FIG. 15B shows the cross section from FIG. 14B after the process steps from FIG. 15A; and FIG. 15C shows the plan view of FIG. 14C after the process steps from FIG. 15A. This plan view illustrates the depressions, the isolation trenches, the word lines and the bit lines.

DESCRIPTION OF THE PREFERRED EMBODIMENTS

Figure 1A:
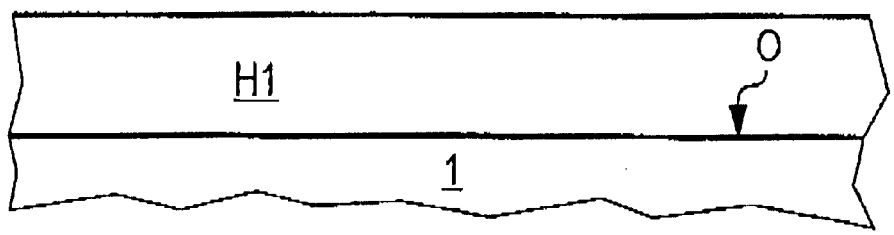
FIG. 1A shows a cross section through a substrate after a first auxiliary layer, a first mask layer, a second mask layer, and auxiliary. trenches have been produced.

Referring now to the figures of the drawing in detail and first, particularly, to FIG. 1A thereof, there is seen an exemplary embodiment in which the starting material is a substrate 1 essentially comprising p-doped silicon with a dopant concentration of approximately $10^{15}$ cm$^{-3}$. $SiO_2$ is grown by thermal oxidation to a thickness of approximately 8 nm on a surface O of the substrate 1 (not illustrated).

A first auxiliary layer H1 is subsequently produced by silicon nitride being deposited to a thickness of approximately 400 nm (see FIGS. 1A and 1B).

Figure 1B:
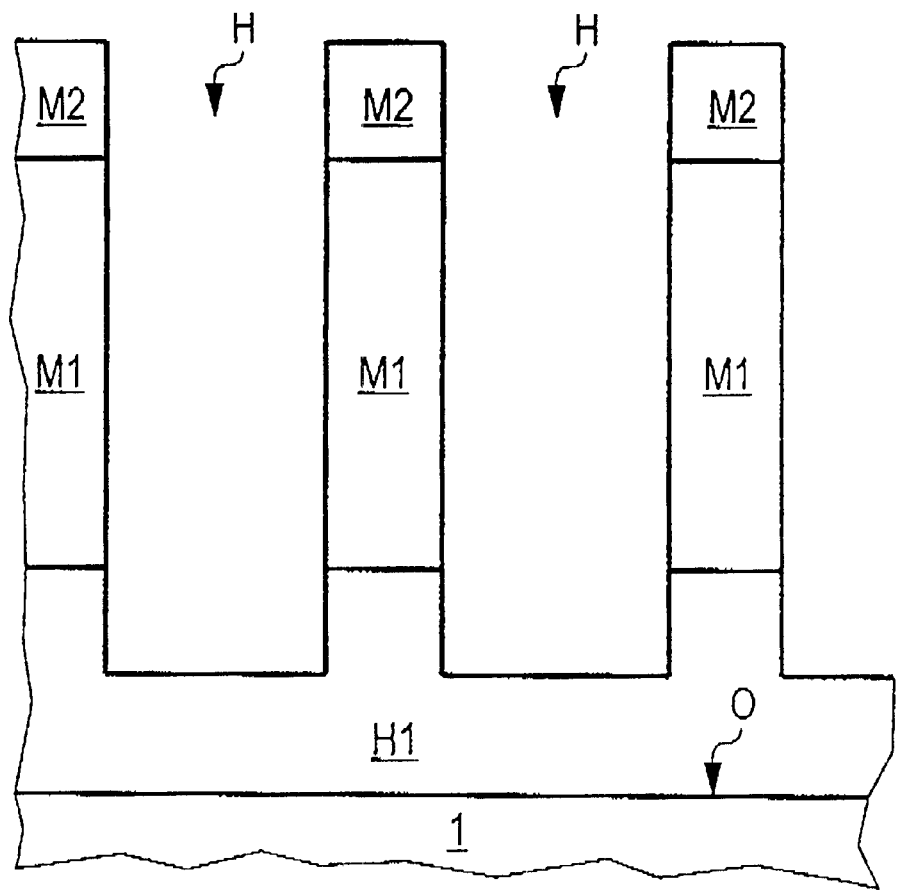
FIG. 1B shows a cross section—perpendicular to the cross section from FIG. 1A—through the substrate after the process steps from FIG. 1A.

In order to produce a first mask layer M1, BPSG (borophosphorus silicate glass) is deposited to a thickness of approximately 800 nm (see FIG. 1B).

In order to produce a second mask layer M2, silicon nitride is deposited to a thickness of approximately 200 nm (see FIG. 1B).

With the aid of a non-illustrated first photoresist mask, the first mask layer M1 and the second mask layer M2 are patterned in strip form and auxiliary trenches H are produced in the first auxiliary layer H1 (see FIGS. 1B and 1C). The auxiliary trenches are approximately 300 nm wide and are at a distance of approximately 150 nm from one another. The second mask layer M2 and the first auxiliary layer Hi are etched using $C_2F_6+O_2$, for example. The first mask layer M1 is etched using $CHF_3+O_2$, for example. The first photoresist mask is subsequently removed.

Figure 2B:
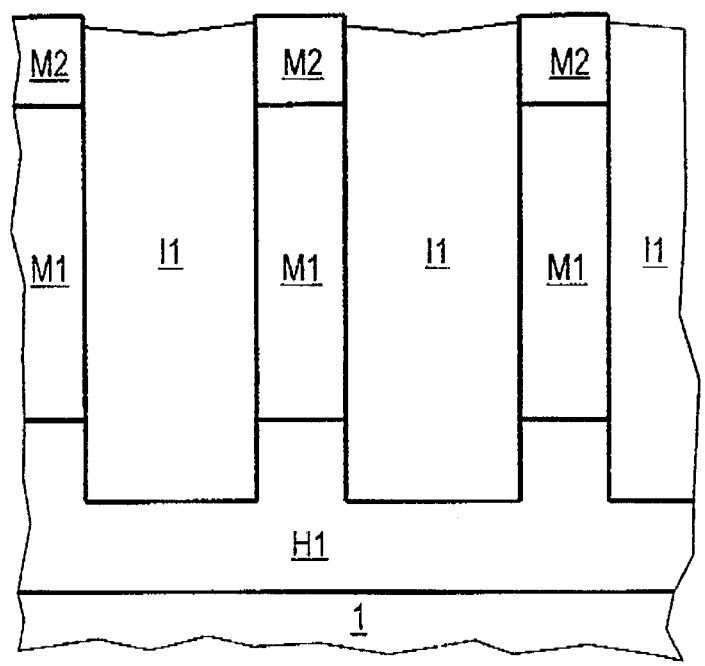
FIG. 2B shows the cross section from FIG. 1B after the process steps from FIG. 2A.
Figure 3A:
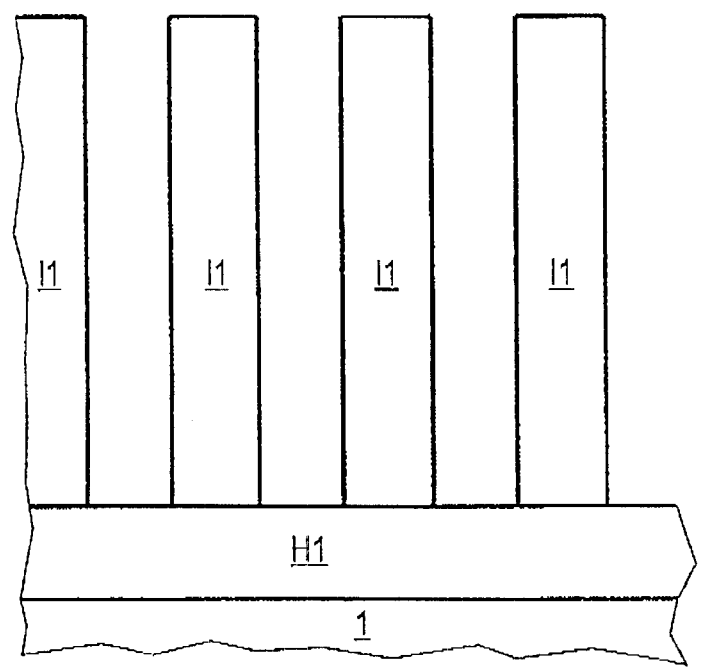
FIG. 3A shows the cross section from FIG. 2A after parts of the bottoms of the auxiliary trenches have been uncovered.
Figure 3B:
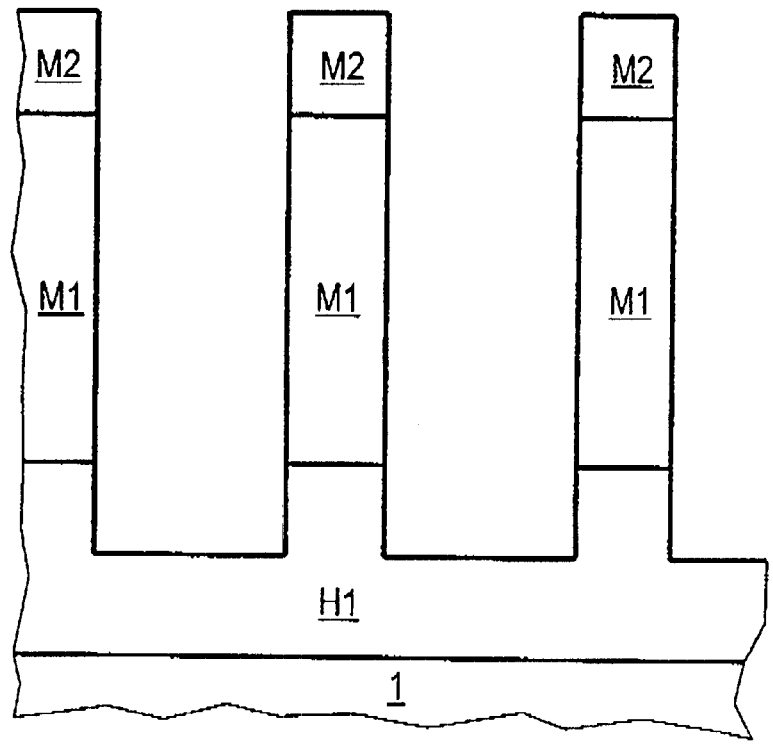
FIG. 3B shows the cross section from FIG. 2B after the process steps from FIG. 3A.
Figure 3C:
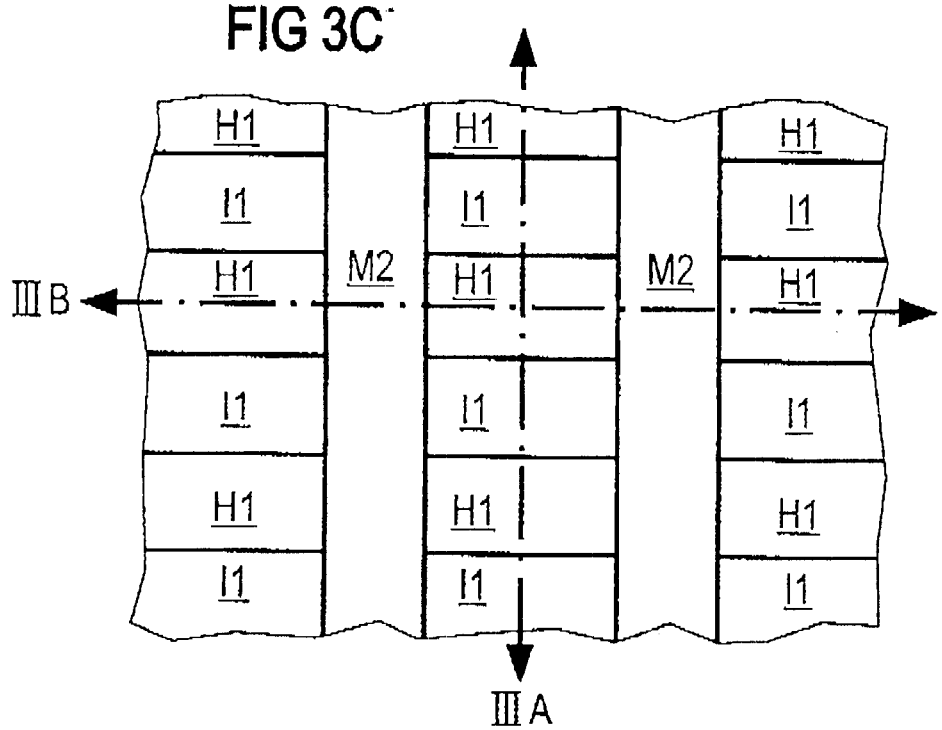
FIG. 3C shows the plan view from FIG. 1C after the process steps from FIG. 3A, illustrating the second mask layer, the first insulating structures and the uncovered bottoms of the first auxiliary layer.

In the auxiliary trenches H and between the parts of the patterned first mask layer M1 and the patterned second mask layer M2, first insulating structures I1 are produced by $SiO_2$ being deposited to a thickness of approximately 300 nm and being etched back using $CHF_2+O_2$, for example, until the second mask layer M2 is uncovered (see FIGS. 2A and 2B). With the aid of a strip-type second photoresist mask (not illustrated) whose strips run transversely with respect to the auxiliary trenches H, have a width of approximately 150 nm and are at a distance of approximately 150 nm from one another, $SiO_2$ is removed selectively with respect to silicon nitride using $CHF_3O_2$, for example. Parts of the bottoms of the auxiliary trenches H are uncovered as a result (see FIGS. 3A, 3B and 3C). In addition to the second photoresist mask, the second mask layer M2 acts as a mask in this case. The second photoresist mask is removed.

Figure 4:
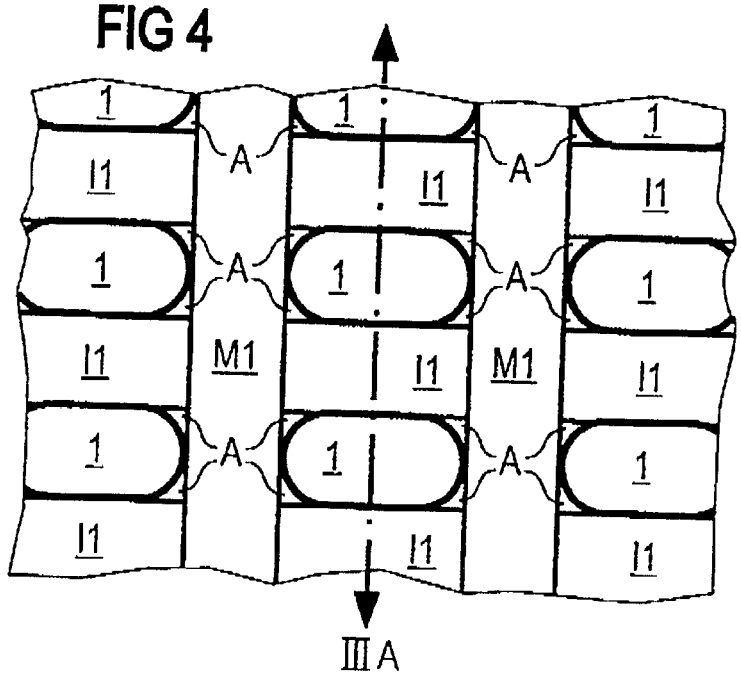
FIG. 4 shows the plan view from FIG. 3C after parts of the substrate have been uncovered, the first mask layer has been removed and rounding elements have been produced. This plan view illustrates the rounding elements, the first mask layer, the uncovered parts of the substrate and the first insulating structures.

Rounding elements A are subsequently produced by $SiO_2$ being deposited to a thickness of approximately 60 nm and etched back until the second mask layer M2 is uncovered. $SiO_2$ is subsequently etched isotropically to a depth of approximately 60 nm using HF, for example, with the result that the rounding elements A are produced from remaining parts of the deposited $SiO_2$ in edges which are formed by the first mask layer M1, and respectively the second mask layer M2 and the first insulating structures I1 (see FIG. 4).

Silicon nitride is subsequently etched selectively with respect to $SiO_2$ until the substrate 1 is partly uncovered. In this case, the first auxiliary layer H1 is partly removed in the region of the auxiliary trenches H, and the second mask layer M2 is removed.

Depressions V having a depth of approximately 10 $\mu$m are produced in the uncovered parts of the substrate 1. A suitable etchant is HBr+HS, for example. In this case, etching is effected selectively with respect to $SiO_2$ (see FIGS. 5A and 5B). The first mask layer M1, the first insulating structures I1 and the rounding elements A thus act as a mask.

On account of the rounding elements A, sidewalls of the depressions V have no edges. Planar sections of the sidewalls of the depressions V run in the direction of the strips of the second photoresist mask.

$SiO_2$ is subsequently etched using $CHF_3+O_2$, for example, until the first mask layer M1, the first insulating structures I1 and the rounding elements A are removed.

In order to produce a common capacitor electrode K for capacitors, arsenic glass is deposited to a thickness of approximately 20 nm. PMMA (polymethyl methacrylate) is deposited over that to a thickness of approximately 500 nm and etched back to a depth of approximately 1.5 µm using $O_2$, for example. Finally, uncovered parts of the arsenic glass are removed using HF, for example. By means of a heat-treatment step, arsenic diffuses from the arsenic glass into the substrate 1, with the result that the capacitor electrode K is produced as a contiguous doped region in the substrate 1 (see FIGS. 5A and 5B).

In order to produce first parts of insulations I, silicon nitride is grown to a thickness of approximately 3 nm and oxidized to a depth of approximately 1 nm by thermal oxidation. Afterwards, in situ n-doped polysilicon is deposited to a thickness of approximately 300 nm and etched back to a depth of approximately 2 µm proceeding from the surface O. Uncovered parts of the first parts of the insulations I are removed using HF, for example.

Figure 5A:
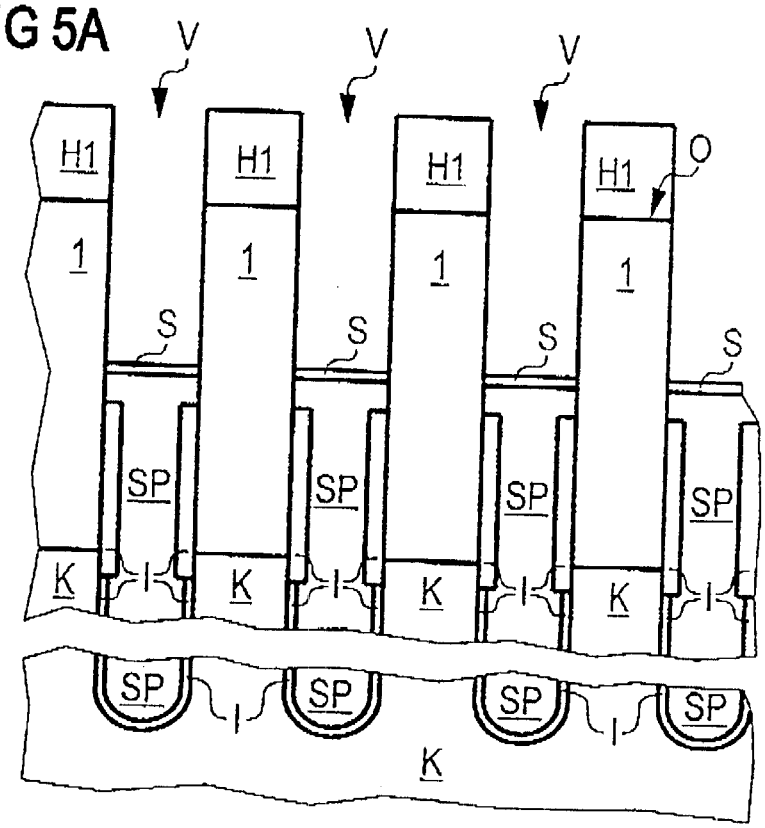
FIG. 5A shows the cross section from FIG. 3A after the process steps from FIG. 4 and after depressions, a capacitor electrode, insulations, storage nodes and an insulating layer have been produced and the first mask layer has been removed.

Second parts of the insulations I are produced by $SiO_2$ being deposited to a thickness of approximately 20 nm and etched back until the polysilicon is uncovered (see FIGS. 5A and 5B). The second parts of the insulations I are arranged above the capacitor electrode 10 and are made particularly thick in comparison with the first parts of the insulations I.

Afterward, in situ n-doped polysilicon is deposited to a thickness of approximately 300 nm and planarized by chemical mechanical polishing until the first auxiliary layer H1 is uncovered and etched back to a depth of approximately 800 nm. $SiO_2$ is subsequently etched isotropically to a depth of approximately 60 nm using HF, for example, thereby further shortening the insulations I. Those parts of the insulations I which are removed in this case are replaced by amorphous silicon by the amorphous silicon being deposited to a thickness of approximately 20 nm and etched back isotropically to an extent of approximately 30 nm using $C_2F_6+O_2$, for example. Storage nodes SP of the capacitors are produced from the n-doped polysilicon and the amorphous silicon. Above the second parts of the insulations I, the storage nodes SP directly adjoin the substrate 1 (see FIGS. 5A and 5B).

An insulating layer S having a thickness of approximately 40 nm is produced on the storage nodes SP by means of an HDP (high density plasma) process, by $SiO_2$ being deposited and at the same time etched essentially isotropically, more being deposited on horizontal areas than on lateral areas (see FIGS. 5A and 5B).

In order to produce a protective oxide SO, $SiO_2$ is deposited to a thickness of 5 nm (see FIGS. 6A and 6B).

Amorphous silicon is subsequently deposited to a thickness of approximately 40 nm (see FIGS. 6A and 6B).

Parts of the amorphous silicon are doped by inclined implantation with p-doping ions (see FIGS. 6A and 6B). The inclined implantation is effected at an angle of approximately 30° to the surface O and at an angle of 90° with respect to the course of the auxiliary trenches H.

Figure 7B:
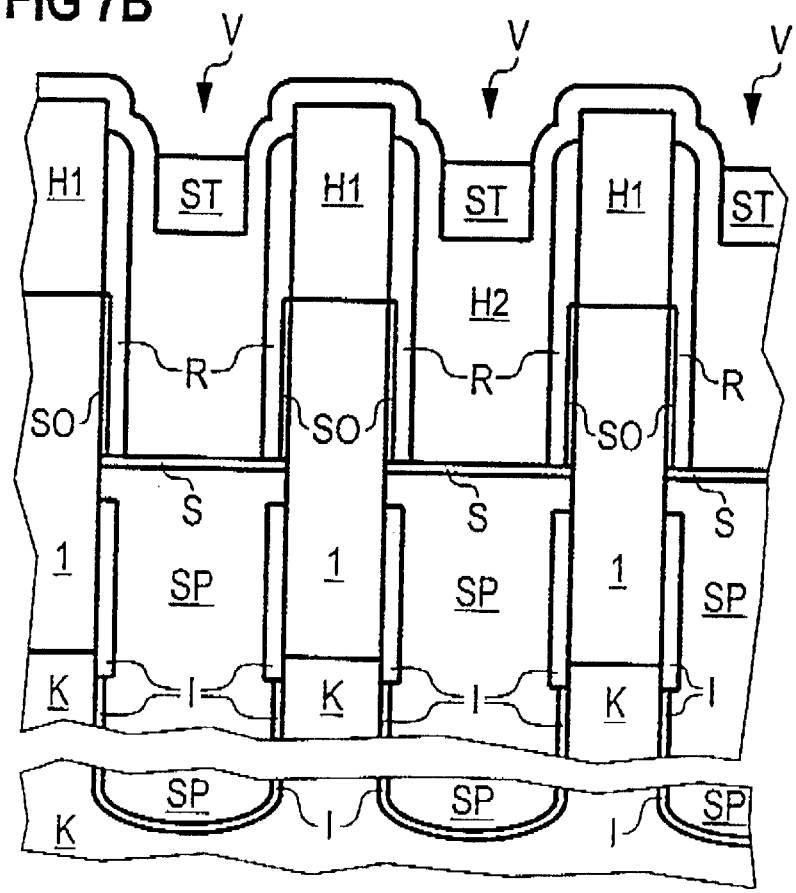
FIG. 7B shows the cross section from FIG. 6B after the process steps from FIG. 7A.

In order to produce spacers R, the amorphous silicon is etched back to an extent of approximately 90 nm using $C_2S_6+O_2$, for example, with the result that the spacers R reach a point approximately 50 nm below the adjoining parts of the first auxiliary layer H1 (see FIGS. 7A and 7B). First parts of the spacers R are p-doped, while remaining parts of the spacers R are undoped.

In order to produce a second auxiliary layer H2, $SiO_2$ is deposited to a thickness of approximately 40 nm.

Figure 7C:
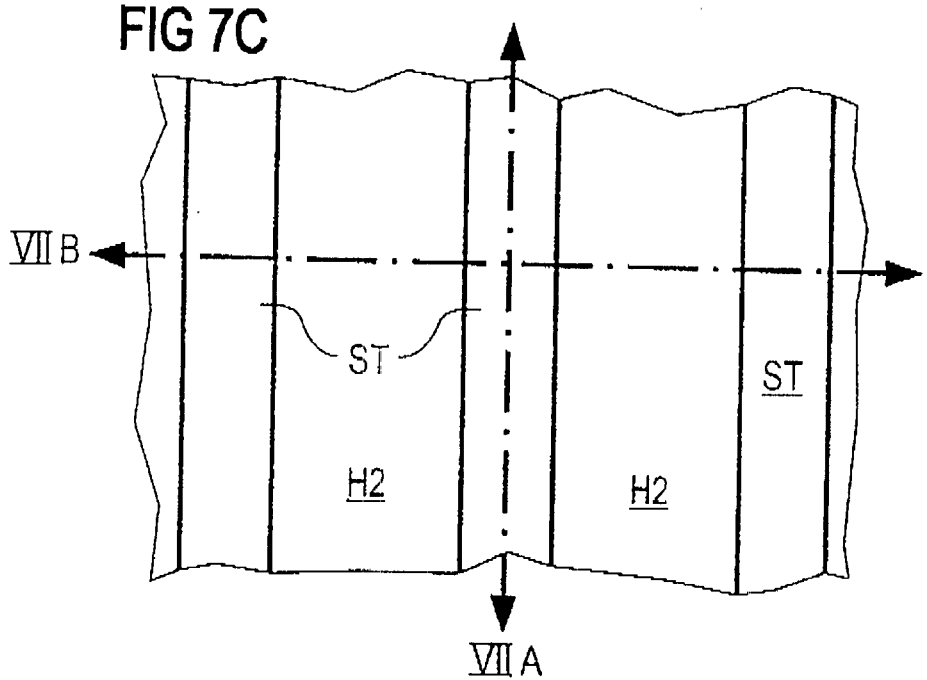
FIG. 7C shows the plan view from FIG. 4 after the process steps according to FIG. 7A. This plan view illustrates the strip-type structures and uncovered parts of the second auxiliary layer.

Amorphous silicon is subsequently deposited to a thickness of approximately 200 nm and planarized by chemical mechanical polishing, until the second auxiliary layer H2 is reached, and subsequently etched back to a depth of approximately 100 nm, with the result that amorphous silicon is arranged only in the auxiliary trenches H and forms strip-type structures ST (see FIGS. 7A, 7B and 7C).

Figure 8A:
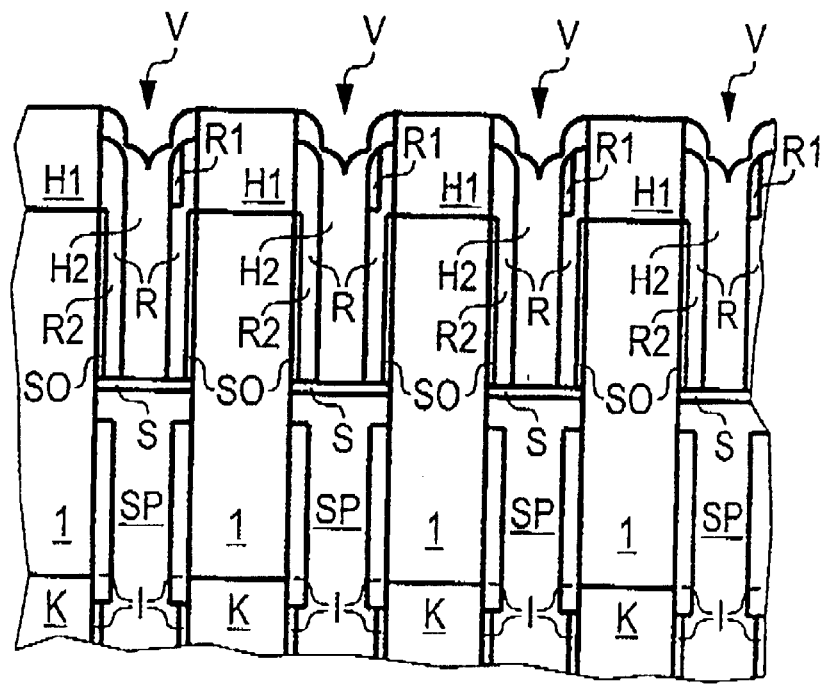
FIG. 8A shows the cross section from FIG. 7A after uncovered parts of the second auxiliary layer have been uncovered, the spacers have been separated, the insulating layer has been partly removed and the storage nodes have been incipiently etched.
Figure 8B:
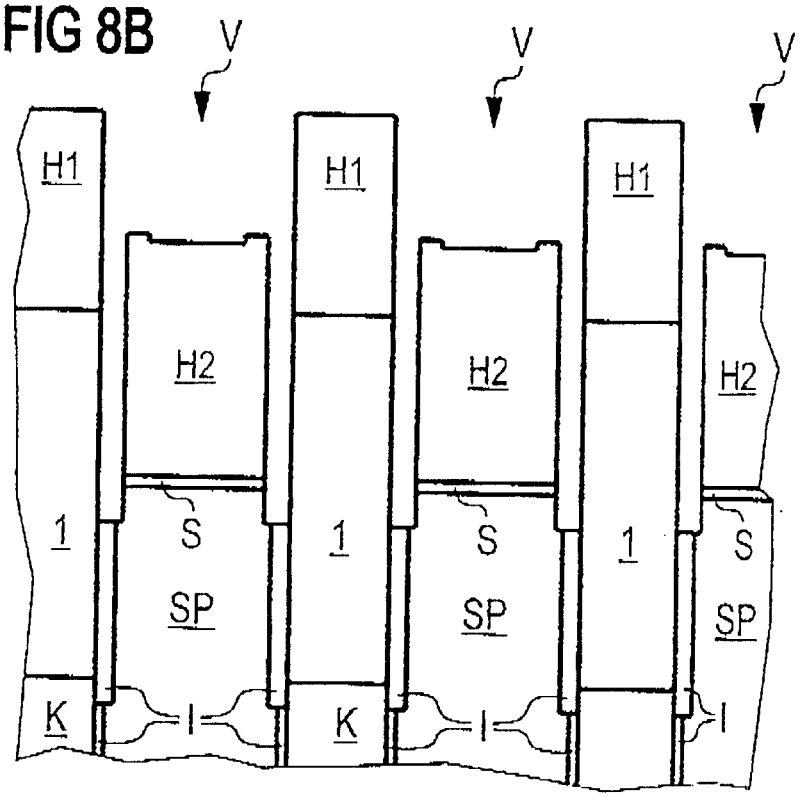
FIG. 8B shows the cross section from FIG. 7B after the process steps from FIG. 8A.
Figure 8C:
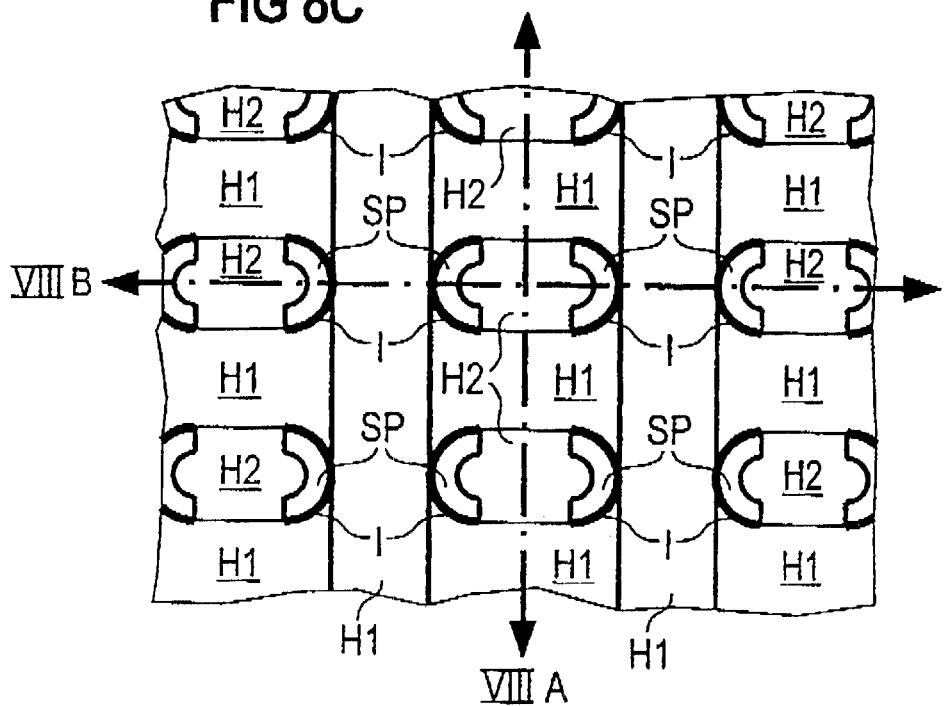
FIG. 8C shows the plan view from FIG. 7B after the process steps from FIG. 8A. This plan view illustrates parts of the second auxiliary layer, uncovered parts of the insulations and of the storage nodes, parts of the bottoms of the auxiliary trenches and also parts of the first auxiliary layer which are arranged outside the bottoms.

$SiO_2$ is subsequently etched to an extent of approximately 300 nm selectively with respect to silicon nitride and silicon, with the result that uncovered parts of the second auxiliary layer H2 are removed. As a result, parts of the spacers R which are arranged in the region of sidewalls of the auxiliary trenches H are uncovered. By etching silicon selectively with respect to $SiO_2$, these parts of the spacers R and also the strip-type structures ST are removed until the insulating layer S is partly-uncovered (see FIGS. 8B and 8C). As a result, the spacers R are separated. Each of the spacers R comprises a first part R1, which is p-doped by the inclined implantation, and a second part R2, which is electrically isolated from the first part R1 on account of the separation and is opposite the first part R1.

The uncovered parts of the insulating layer S are subsequently removed. Uncovered parts of the protective oxide SO are removed in the process. Uncovered parts of the storage nodes SP are etched to a depth of approximately 50 nm.

Figure 9A:
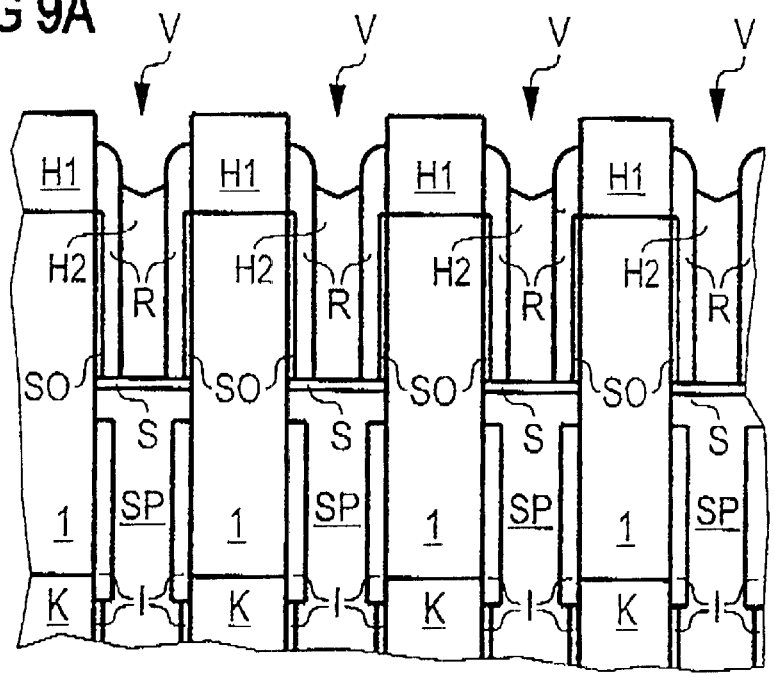
FIG. 9A shows the cross section from FIG. 8A after the insulations have been enlarged, the spacers have been uncovered and dopant has diffused from first parts of the spacers.
Figure 9B:
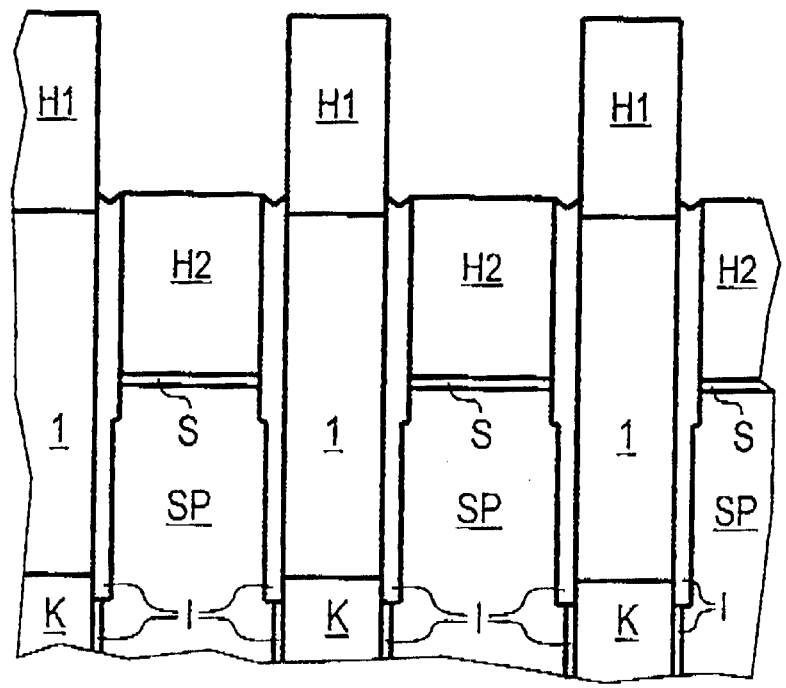
FIG. 9B shows the cross section from FIG. 8B after the process steps from FIG. 9A.

The removed parts of the storage nodes SP are replaced by insulating material, by $SiO_2$ being deposited to a thickness of approximately 50 nm (see FIG. 9B). The insulations I are thereby enlarged.

A heat-treatment step is subsequently carried out, during which dopant diffuses from the first part of the spacers R1 into adjoining parts of the spacers R and is distributed essentially homogeneously (see FIG. 9A). The amorphous silicon is converted into polysilicon in the process.

$SiO_2$ is subsequently etched isotropically to an extent of approximately 100 nm using HF, for example.

Figure 10A:
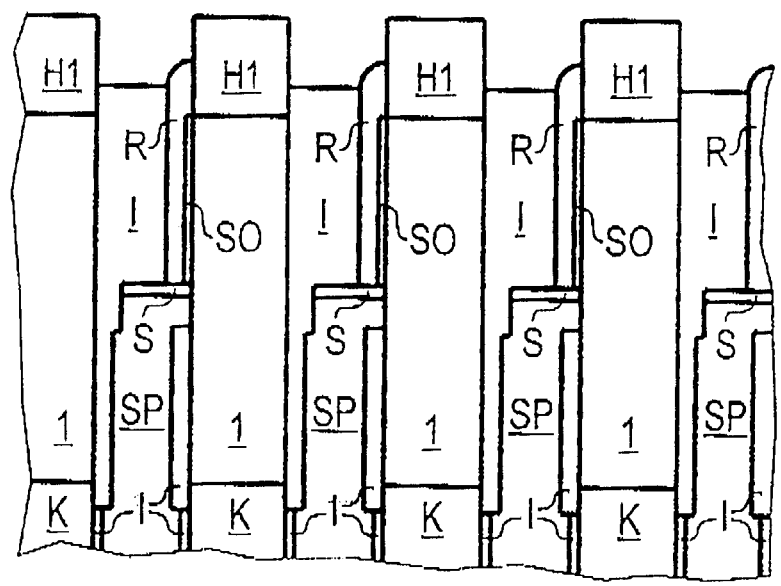
FIG. 10A shows the cross section from FIG. 9A after first parts of the spacers have been removed, parts of the insulating layer have been removed, first parts of the storage nodes have been removed and the insulations have been enlarged.
Figure 10B:
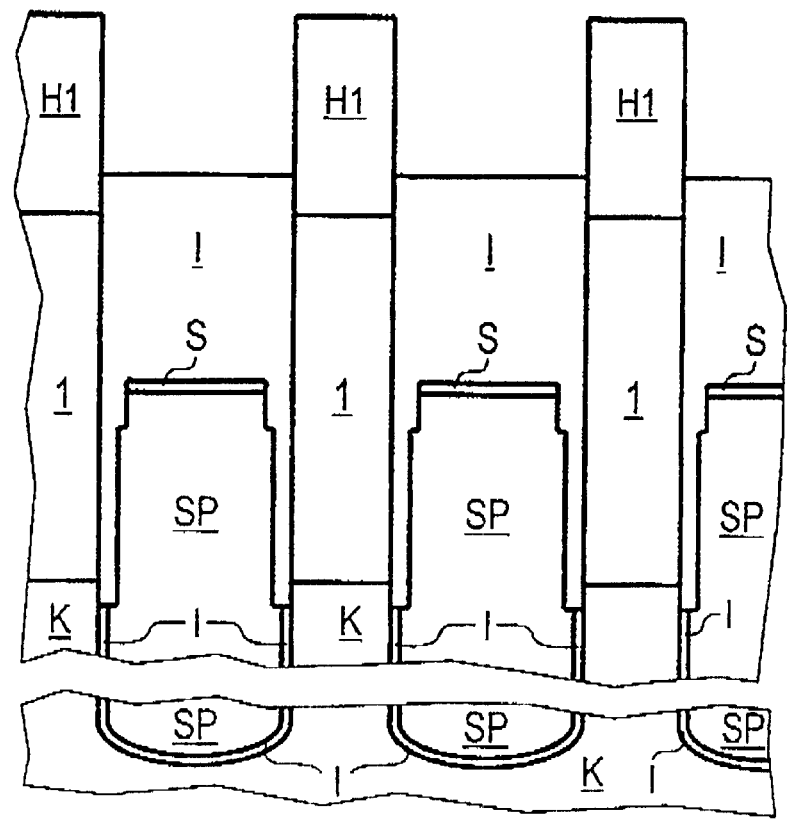
FIG. 10B shows the cross section from FIG. 9B after the process steps from FIG.10A.
Figure 10C:
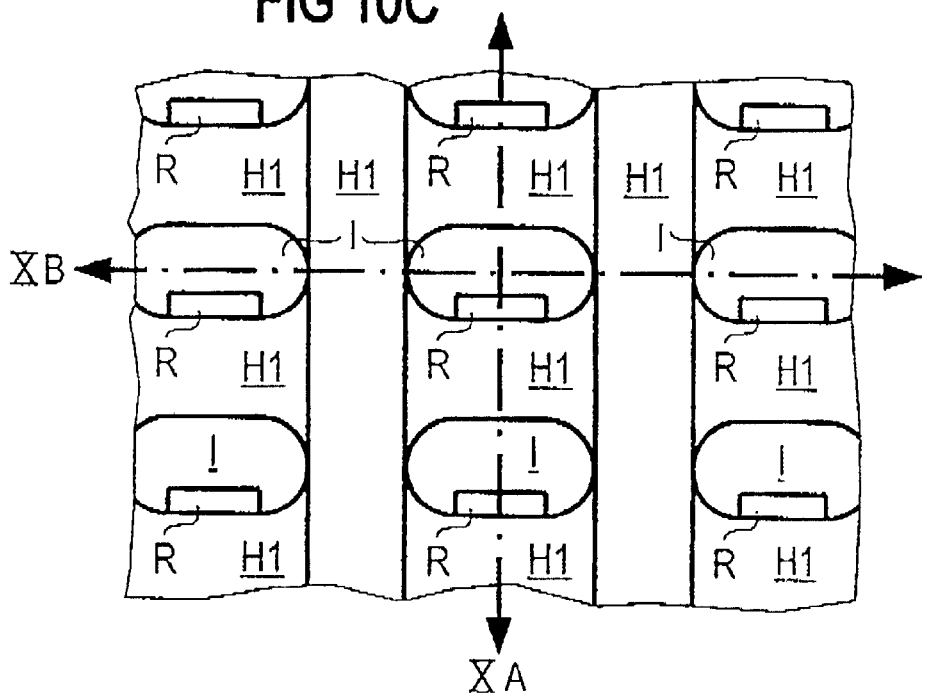
FIG. 10C shows the plan view of FIG. 8C after the process steps from FIG. 10A. This plan view illustrates the second parts of the spacers, the insulations and the first auxiliary layer.

The separated spacers R are subsequently patterned by undoped polysilicon being etched selectively with respect to p-doped polysilicon. A suitable etchant is choline, for example. As a result, the second parts of the spacers R2 are removed and parts of the insulating layer S are uncovered (see FIGS. 10A, 10B and 10C).

The uncovered parts of the insulating layer S are removed, with the result that first parts of the storage nodes SP are uncovered. Uncovered parts of the protective oxide SO are also removed in the process. The first parts of the storage nodes SP are subsequently removed by polysilicon being etched to a depth of approximately 50 nm (see FIG. 10A). The insulations I are altered by $SiO_2$ being deposited to a thickness of approximately 300 nm and being planarized by chemical mechanical polishing, until the first auxiliary layer H1 is uncovered, and subsequently being etched back to a depth of approximately 350 nm. Only second parts of the storage nodes SP which are arranged below the first parts of the spacers R1 adjoin the substrate 1 (see FIGS. 10A and 10B).

Since the second auxiliary layer H2 is composed of the same material as the insulations I, it is expedient if hereinafter the second auxiliary layer H2 is regarded as part of the insulations I.

The first parts of the spacers R1 and also the associated parts of the spacers R are subsequently removed by polysilicon being etched selectively with respect to $SiO_2$ until parts of the insulating layer S are uncovered.

Figure 11A:
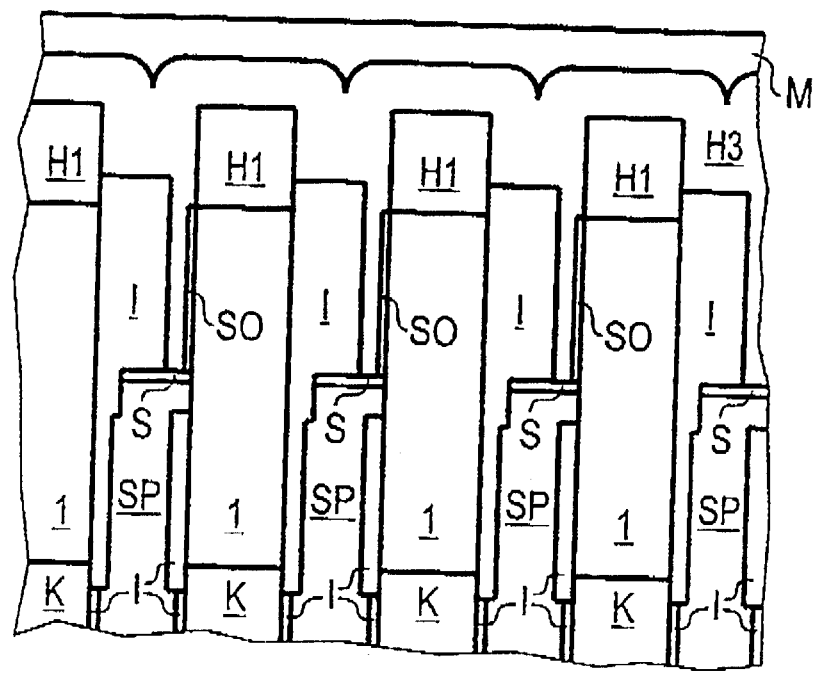
FIG. 11A shows the cross section from FIG. 10A after the second parts of the spacers have been removed and a third auxiliary layer and a mask have been produced.
Figure 11B:
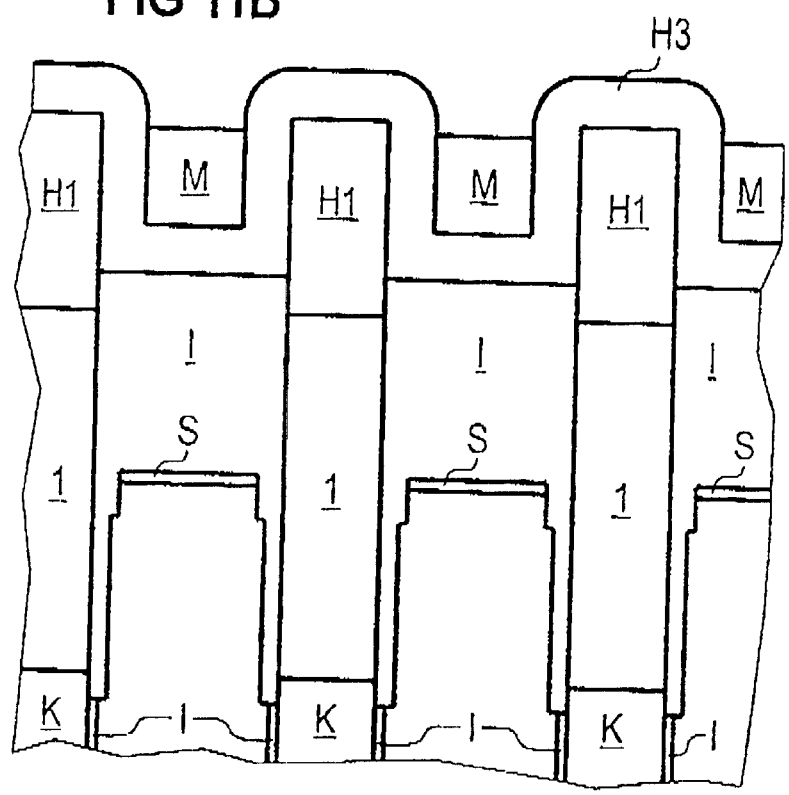
FIG. 11B shows the cross section from FIG. 10B after the process steps from FIG. 11A.
Figure 11C:
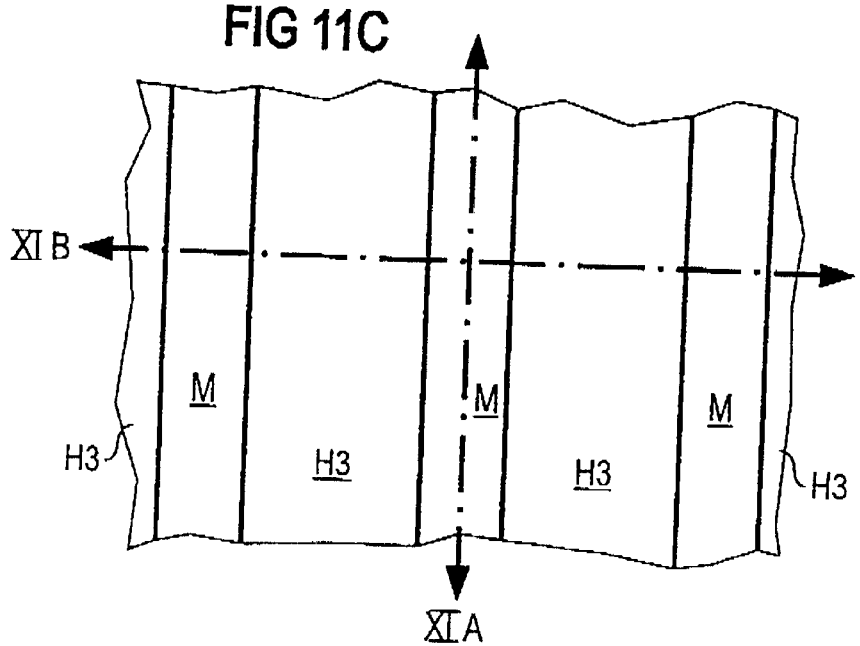
FIG. 11C shows the plan view of FIG. 10C after the process steps from FIG. 11A. This plan view illustrates the mask and uncovered parts of the third auxiliary layer.

In order to produce a third auxiliary layer H3, silicon nitride is deposited to a thickness of approximately 80 nm (see FIGS. 11A, 11B and 11C). Afterward, $SiO_2$ is deposited to a thickness of approximately 300 nm and planarized by chemical mechanical polishing, until the first auxiliary layer H1 is uncovered, and subsequently etched back 100 nm, with the result that a strip-type mask M is formed from the $SiO_2$. A strip of the mask M is arranged in each of the auxiliary trenches H (see FIGS. 11A, 11B and 11C).

Figure 12:
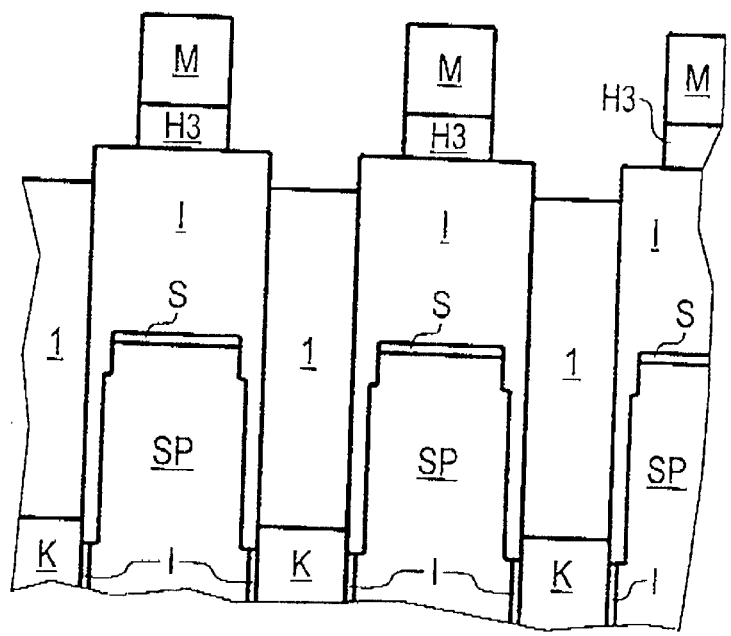
FIG. 12 shows the cross section from FIG. 11B after uncovered parts of the third auxiliary layer and parts of the first auxiliary layer which are arranged underneath have been removed.

Uncovered parts of the third auxiliary layer H3 are removed selectively with respect to the mask M (see FIG. 12). In this case, parts of the first auxiliary layer H1 which are arranged outside the mask M are also removed, with the result that parts of the substrate 1 which are arranged underneath are uncovered (see FIG. 12).

Figure 13A:
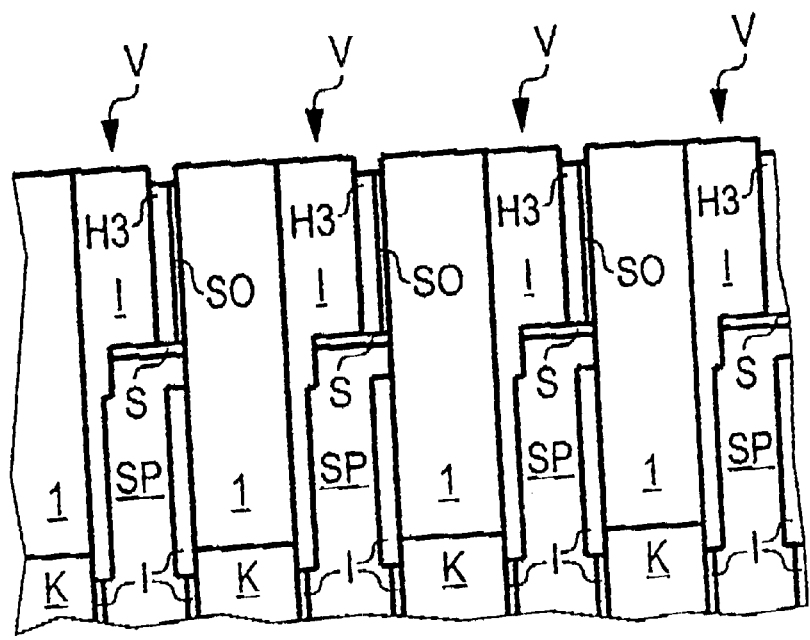
FIG. 13A shows the cross section from FIG. 11A after the process steps from FIG. 12 and after isolation trenches have been produced and the mask and the first auxiliary layer have been removed.
Figure 13B:
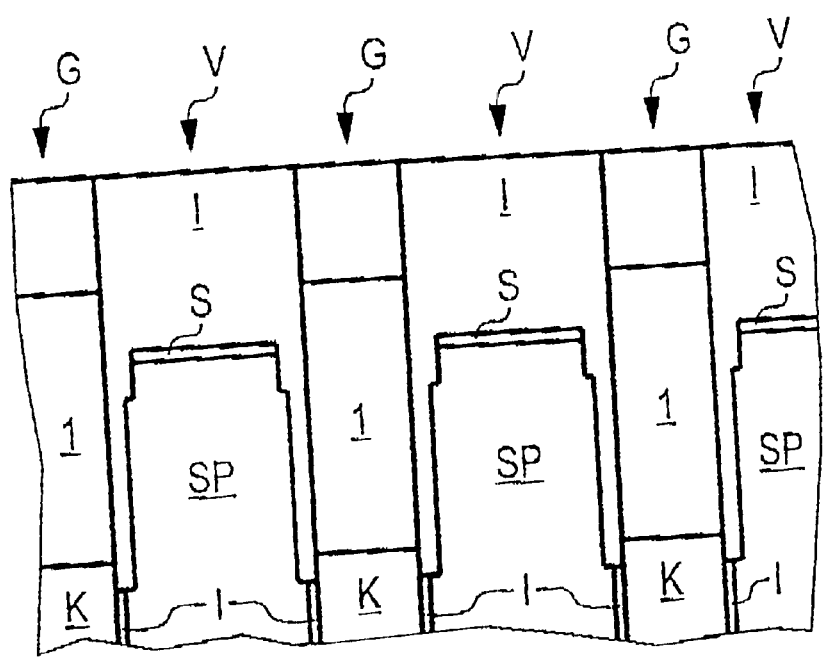
FIG. 13B shows the cross section from FIG. 12 after the process steps from FIG. 13A.

In order to produce isolation trenches G, silicon is etched selectively with respect to $SiO_2$ to a depth of approximately 200 nm using, for example, HBr and HF (see FIG. 13B). Afterward, $SiO_2$ is deposited to a thickness of approximately 300 nm and planarized by chemical mechanical polishing until the third auxiliary layer H3 is uncovered. The mask M is removed in the process. $SiO_2$ is subsequently etched back to a depth of approximately 300 nm.

Silicon nitride is subsequently etched back to a depth of approximately 500 nm, with the result that parts of the third auxiliary layer H3 which are arranged outside the depressions V are removed and the first auxiliary layer H1 is removed (see FIGS. 13A and 13B).

$SiO_2$ is subsequently planarized by chemical mechanical polishing until the substrate 1 is uncovered (see FIGS. 13A and 13B).

By means of implantation with n-doping ions, second source/drain regions S/D2 of transistors which have a depth of approximately 50 nm are produced in the uncovered part of the substrate 1. By means of implantation with p-doping ions, the dopant concentration is increased to $6*10^{17C}$ m$^{-3}$ under the second source/drain regions S/D2.

The third auxiliary layer H3 and the protective oxide SO are removed.

Figure 14A:
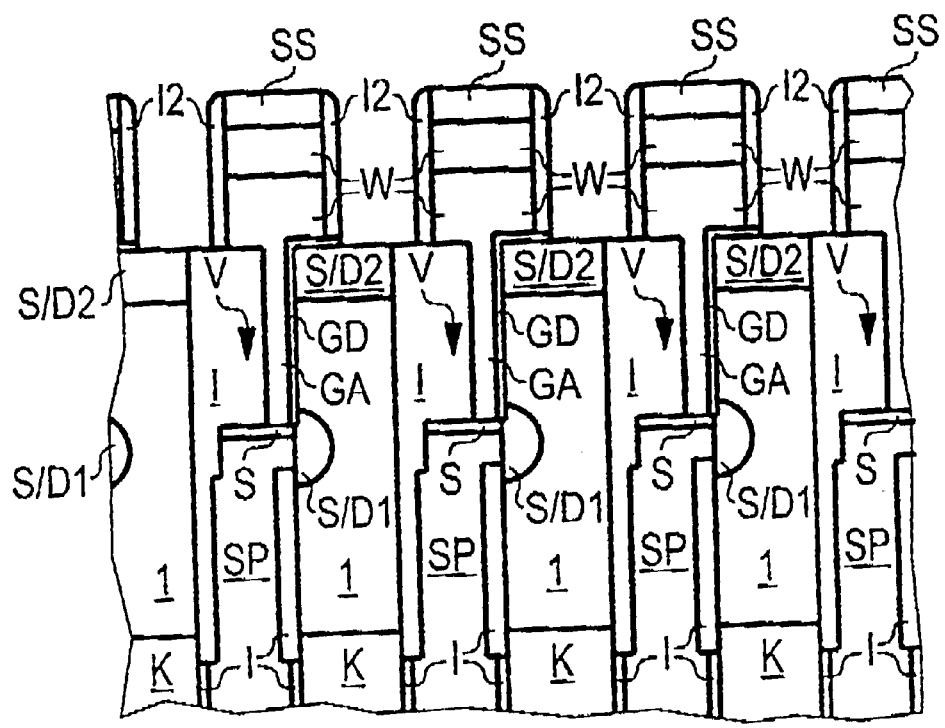
FIG. 14A shows the cross section from FIG. 13A after the third auxiliary layer has been removed and second source/drain regions, a gate dielectric, gate electrodes, word lines, second insulation structures, a protective layer and first source/drain regions have been produced.
Figure 14B:
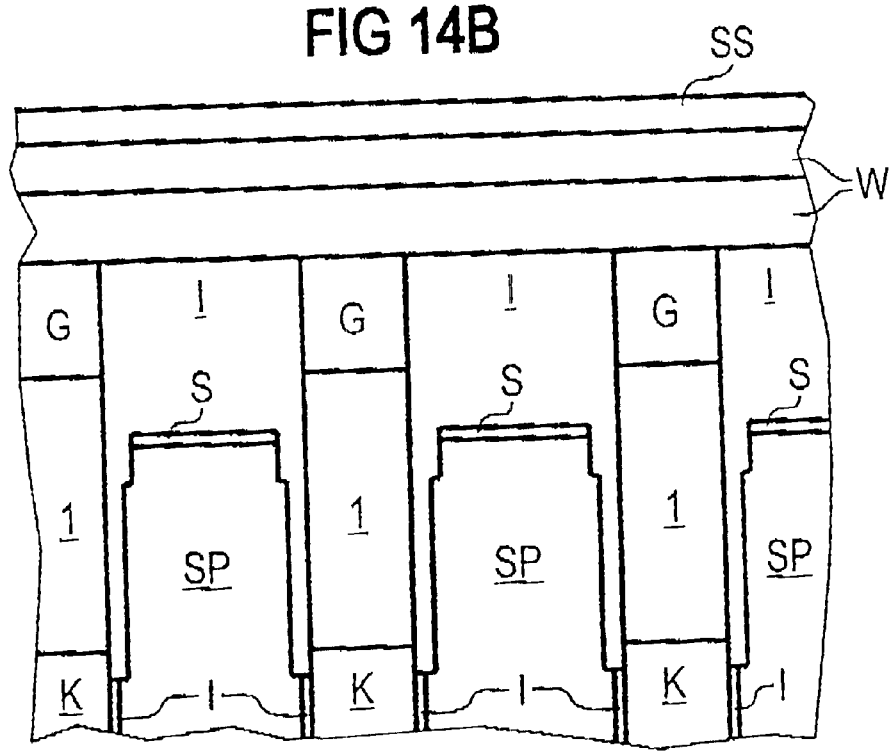
FIG. 14B shows the cross section from FIG. 13B after the process steps from FIG. 14A.

By means of a heat-treatment step, a gate dielectric GD having a thickness of approximately 4 nm is produced on uncovered parts of the sidewalls of the depressions V (see FIGS. 14A and 14B). During the heat-treatment step, dopant diffuses from the storage nodes SP into the substrate 1, where it forms first source/drain regions S/D1 of the transistors. Furthermore, the dopant of the second source/drain regions S/D2 diffuses in such a way that the second source/drain regions S/D2 acquire a thickness of approximately 100 nm and have a dopant concentration of approximately $10^{20}$ cm$^{-3}$.

Figure 14C:
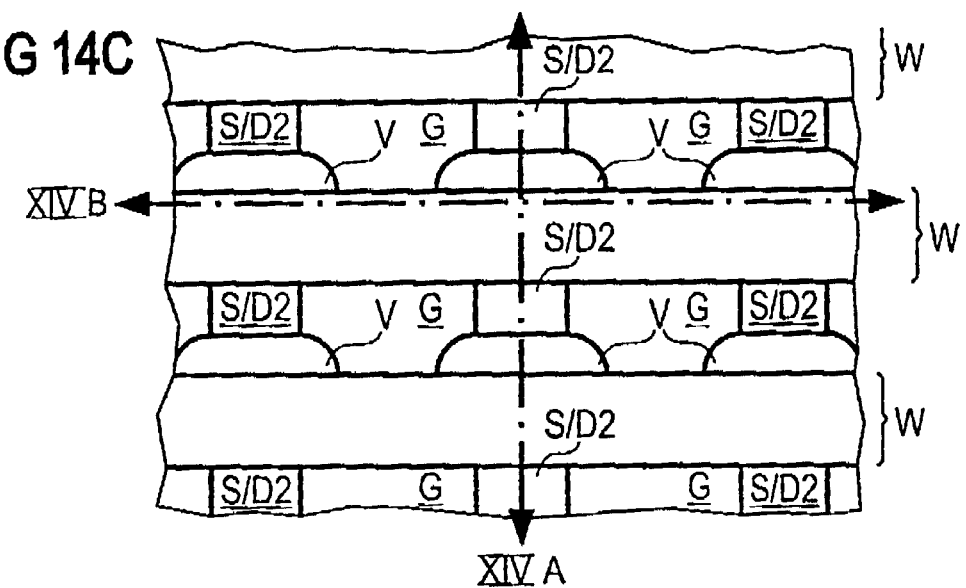
FIG. 14C shows the plan view from FIG. 11C after the process steps from FIG. 14A. This plan view illustrates the depressions, the word lines, the isolation trenches and the second source/drain regions.

In order to produce gate electrodes GA and word lines W, in situ n-doped polysilicon is deposited to a thickness of approximately 100 nm. Tungsten silicide is deposited over that to a thickness of approximately 50 nm. In order to produce a protective layer SS, silicon nitride is deposited to a thickness of approximately 100 nm (see FIGS. 14A and 14B). The protective layer SS is patterned with the aid of a strip-type third photoresist mask (not illustrated), which corresponds to the second photoresist mask but is arranged offset with respect to the second photoresist mask in such a way that it only partly covers the depressions V. The third photoresist mask is subsequently removed. With the aid of the protective layer SS as a mask, the tungsten silicide and polysilicon are etched until the gate dielectric GD is uncovered above the second source/drain regions S/D2. The gate electrodes GA are formed from the polysilicon in the depressions V which replaces the second parts of the spacers R. Word lines W running transversely with respect to the auxiliary trenches H are produced from polysilicon and tungsten silicide arranged above said gate electrodes (see FIGS. 14A, 14B and 14C).

In order to produce spacer-type second insulating structures I2, silicon nitride is deposited to a thickness of approximately 300 nm and etched back. The protective layer SS and the second insulating structures I2 surround the word lines W (see FIGS. 14A and 14B).

In order to produce an intermediate oxide Z, $SiO_2$ is deposited to a thickness of approximately 400 nm.

With the aid of a non-illustrated fourth photoresist mask, contact holes are opened to the second source/drain regions S/D2, $SiO_2$ being etched selectively with respect to silicon, nitride, with the result that the protective layer SS and the second insulating structures I2 protect the word lines W.

In order to produce contacts KO in the contact holes, in situ doped polysilicon is deposited to a thickness of approximately 100 nm and planarized by chemical mechanical polishing until the intermediate oxides Z is uncovered.

Figure 15A:
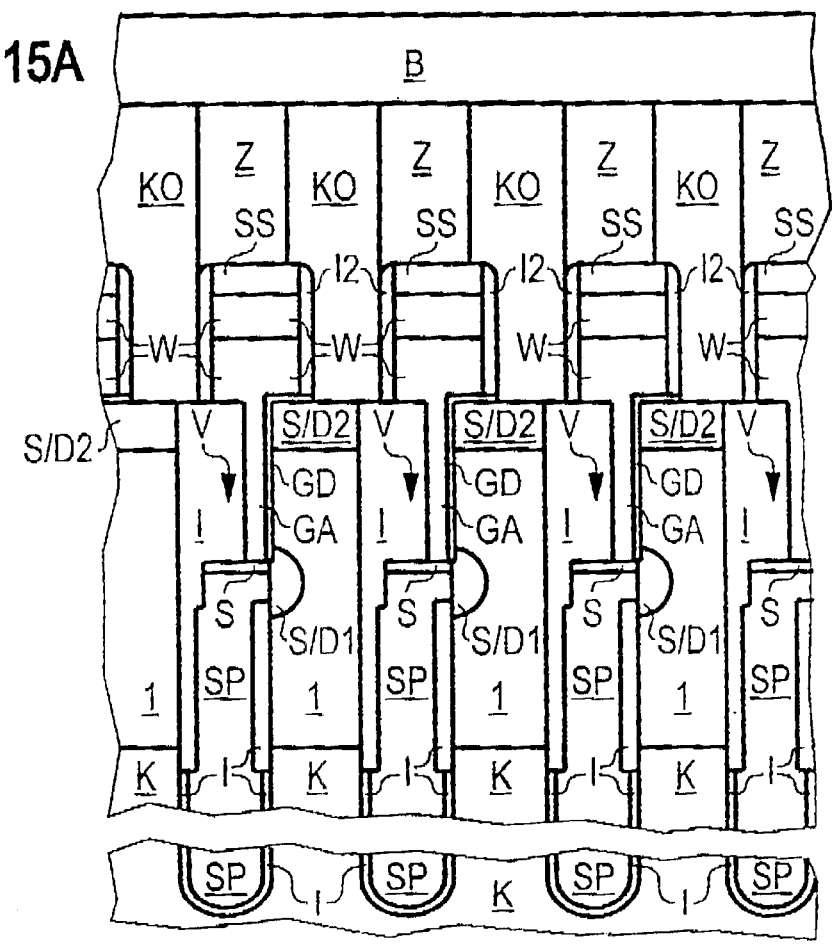
FIG. 15A shows the cross section from FIG. 14A after an intermediate oxide, contacts and bit lines have been produced.

In order to produce bit lines B, tungsten silicide is deposited to a thickness of approximately 200 nm and patterned with the aid of a fifth strip-type photoresist mask, which corresponds to the first photoresist mask (see FIGS. 15A, 15B and 15C).

A memory cell of the DRAM cell configuration produced comprises one of the capacitors and one of the transistors connected thereto. The transistors are formed as vertical transistors in which a channel current is formed in the vertical direction. Parts of the substrate which are arranged between the first source/drain regions and the second source/drain regions act as channel regions of the transistors. The channel regions of the transistors are electrically connected to one another, with the result that floating body effects are avoided.

There are many conceivable variations of the exemplary embodiment which likewise lie within the scope of the invention. In particular, dimensions of the above-described layers, masks, depressions and structures can be adapted to the respective requirements.

The implantation for the different doping of the first parts and of the second parts of the spacers can also be carried out after the production of the spacers.

To ensure that the auxiliary trenches obtain a particularly accurately defined depth, it lies within the scope of the invention to provide, within the first auxiliary layer, an etching stop layer which acts as an etching stop during the production of the auxiliary trenches. The etching stop layer is composed of $SiO_2$, for example.

I claim:

1. A method of fabricating a DRAM cell configuration, which comprises the following steps:

producing a depression with sidewalls in a substrate;

producing in the depression an insulation and a storage node of a capacitor, wherein the capacitor is at least partly isolated from the substrate by the insulation;

by deposition, etching back, and inclined implantation of silicon, producing a spacer of silicon above the storage node in the depression along sidewalls of the depression, wherein a first part of the spacer and a second part, opposite the first part, of the spacer are doped differently;

patterning the spacer by removing one of the first part of the spacer and the second part of the spacer utilizing the different doping thereof;

altering the insulation and a first part of the storage node disposed under the removed part of the spacer, such that either the first part of the storage node or a second part of the storage node disposed under the remaining part of the spacer, adjoins the substrate, and thereby utilizing the patterned spacer as a mask;

producing a transistor of the memory cell such that a first source/drain region is formed in the substrate adjoining the storage node;

producing and connecting a word line to a gate electrode of the transistor; and producing a bit line running transversely with respect to the word line and connecting the bit line to the memory cell.

2. The method according to claim 1, which comprises first producing the storage node and the insulation such that both the first part of the storage node and the second part of the storage node adjoin the substrate;

removing the first part of the storage node and thereby using the patterned spacer as a mask; and enlarging the insulation such that the insulation replaces the first part of the storage node.

3. The method according to claim 2, which comprises forming a first auxiliary layer on the substrate, forming in the first auxiliary layer auxiliary trenches running substantially parallel to one another and being arranged next to one another, wherein the auxiliary trenches do not cut through the first auxiliary layer;

forming the depressions for the memory cells in the auxiliary trenches;

after the step of producing the spacer, depositing, substantially conformally, a second auxiliary layer made of a first material that is selectively etchable with respect to silicon, whereby the second auxiliary layer is so thin that the auxiliary trenches are not filled;

depositing a second material that is etchable selectively with respect to the first material, and etching the second material back until the second material is present as strip-type structures only within the auxiliary trenches;

removing uncovered parts of the second auxiliary layer selectively with respect to the strip-type structures;

etching silicon until the spacer is separated, whereby the first part of the spacer is electrically isolated from the second part of the spacer;

while using the second auxiliary layer and the first auxiliary layer as a mask, removing parts of the storage node and replacing by insulating material, such that only the first part and the second part of the storage node adjoin the substrate; and patterning the separated spacer.

4. The method according to claim 3, which comprises, after the separation of the spacer, diffusing the dopant implanted in the first part of the spacer with a heat-treatment step.

5. The method according to claim 3, which comprises after the alteration of the insulation and of the storage node, depositing and etching back insulating material until the remaining part of the spacer is uncovered;

removing the remaining part of the spacer;

depositing a third auxiliary layer to a thickness such that the auxiliary trenches are not filled;

depositing and etching back a third material until the third material is present only within the auxiliary trenches and forms a respective strip-type mask in the auxiliary trenches;

removing uncovered parts of the third auxiliary layer selectively with respect to the mask;

removing parts of the first auxiliary layer arranged outside the mask and uncovered parts of the substrate arranged underneath;

etching the substrate selectively with respect to the mask, and thereby forming isolation trenches;

removing the mask and first auxiliary layer;

producing the second source/drain regions in parts of the substrate that are arranged under the mask; and producing the isolation trenches such that the trenches are deeper than the second source/drain regions.

6. The method according to claim 5, wherein a thickness of the third auxiliary layer is equal to a sum of a thickness of the spacer and a thickness of the second auxiliary layer.

7. The method according to claim 1, which comprises producing an insulating layer on the storage node;

producing the spacer on the insulating layer;

after the patterning of the spacer, removing an uncovered part of the insulating layer;

at least partly replacing a remaining part of the spacer by the gate electrode after the completion of the storage node; and producing a second source/drain region of the transistor above the first source/drain region of the transistor, and thereby forming the transistor as a vertical transistor.

8. The method according to claim 1, which comprises defining an implantation of the silicon such that the first part of the spacer is n-doped;

carrying out a thermal oxidation before the patterning of the spacer;

etching the oxide formed in the thermal oxidation until the second part of the spacer is uncovered; and during the patterning of the spacer, etching silicon selectively with respect to the oxide, and thereby removing the second part of the spacer.

9. The method according to claim 1, wherein the step of patterning the spacer comprises etching the first part of the spacer away selectively with respect to the second part of the spacer.

10. The method according to claim 1, wherein the step of patterning the spacer comprises etching the second part of the spacer away selectively with respect to the first part of the spacer.

11. The method according to claim 1, which comprises, after the completion of the storage node, causing dopant to diffuse, during a heat-treatment step, from the storage node into the substrate and forming the first source/drain region at that location.

* * * * *